United States Patent
Sunaga et al.

(10) Patent No.: US 9,633,967 B2
(45) Date of Patent: Apr. 25, 2017

(54) SEMICONDUCTOR MODULE

(71) Applicant: NSK Ltd., Shinagawa-ku, Tokyo (JP)

(72) Inventors: Takashi Sunaga, Tokyo (JP); Noboru Kaneko, Tokyo (JP); Osamu Miyoshi, Tokyo (JP); Ryoichi Suzuki, Gunma (JP)

(73) Assignee: NSK Ltd., Tokyo (JP)

( * ) Notice: Subject to any disclaimer, the term of this patent is extended or adjusted under 35 U.S.C. 154(b) by 0 days.

(21) Appl. No.: 14/910,355

(22) PCT Filed: Oct. 6, 2014

(86) PCT No.: PCT/JP2014/005085
§ 371 (c)(1),
(2) Date: Feb. 5, 2016

(87) PCT Pub. No.: WO2015/059882
PCT Pub. Date: Apr. 30, 2015

(65) Prior Publication Data
US 2016/0181221 A1   Jun. 23, 2016

(30) Foreign Application Priority Data

Oct. 21, 2013 (JP) .................. 2013-218433
Nov. 1, 2013 (JP) .................. 2013-228391
(Continued)

(51) Int. Cl.
*H01L 29/66* (2006.01)
*H01L 27/08* (2006.01)
(Continued)

(52) U.S. Cl.
CPC .......... *H01L 24/41* (2013.01); *H01L 23/3735* (2013.01); *H01L 23/492* (2013.01);
(Continued)

(58) Field of Classification Search
CPC ......... H01L 24/41; H01L 23/37; H01L 23/49; H01L 24/37; H01L 24/40; H01L 24/83; H01L 24/84
(Continued)

(56) References Cited

U.S. PATENT DOCUMENTS 5,872,403 A * 2/1999 Bowman ............ H01L 23/3121
174/549
2007/0069344 A1* 3/2007 Yamashita ........... H01L 23/142
257/666
(Continued)

FOREIGN PATENT DOCUMENTS

JP   10-144841 A   5/1998
JP   2002-246721 A   8/2002
(Continued)

OTHER PUBLICATIONS

International Search Report (PCT/ISA/210) issued in PCT Application No. PCT/JP2014/005085 dated Jan. 13, 2015 with English translation (five pages).
(Continued)

*Primary Examiner* — Jessica Manno
*Assistant Examiner* — Sheikh Maruf
(74) *Attorney, Agent, or Firm* — Crowell & Moring LLP

(57) ABSTRACT

To provide a semiconductor module that has high reliability of electric connection by a solder and is inexpensive. A joint surface of an electrode jointing portion that is opposed to a surface to be jointed of a gate electrode of a bare-chip FET and a joint surface of a substrate jointing portion that is opposed to a surface to be jointed of another wiring pattern include an outgas releasing mechanism that makes outgas generated from a molten solder during solder jointing of a metal plate connector be released from solders interposed between the joint surfaces and the surfaces to be jointed.

11 Claims, 13 Drawing Sheets

(30) Foreign Application Priority Data

| Feb. 21, 2014 | (JP) | 2014-032022 |
|---|---|---|
| Apr. 24, 2014 | (JP) | 2014-090389 |
| Apr. 25, 2014 | (JP) | 2014-091665 |
| May 21, 2014 | (JP) | 2014-104799 |
| Jun. 18, 2014 | (JP) | 2014-124853 |

(51) Int. Cl.

| H01L 23/00 | (2006.01) |
|---|---|
| H01L 25/07 | (2006.01) |
| H01L 25/18 | (2006.01) |
| H01L 23/373 | (2006.01) |
| H01L 23/498 | (2006.01) |
| H01L 23/492 | (2006.01) |
| H01L 29/739 | (2006.01) |
| H01L 29/78 | (2006.01) |

(52) U.S. Cl.
CPC .. *H01L 23/49811* (2013.01); *H01L 23/49838* (2013.01); *H01L 24/37* (2013.01); *H01L 24/40* (2013.01); *H01L 24/83* (2013.01); *H01L 24/84* (2013.01); *H01L 24/92* (2013.01); *H01L 25/07* (2013.01); *H01L 25/072* (2013.01); *H01L 25/18* (2013.01); *H01L 29/7393* (2013.01); *H01L 29/78* (2013.01); *H01L 24/27* (2013.01); *H01L 24/29* (2013.01); *H01L 24/32* (2013.01); *H01L 24/33* (2013.01); *H01L 24/35* (2013.01); *H01L 2224/05553* (2013.01); *H01L 2224/0603* (2013.01); *H01L 2224/2732* (2013.01); *H01L 2224/29101* (2013.01); *H01L 2224/32227* (2013.01); *H01L 2224/32238* (2013.01); *H01L 2224/32245* (2013.01); *H01L 2224/33181* (2013.01); *H01L 2224/352* (2013.01); *H01L 2224/35847* (2013.01); *H01L 2224/3701* (2013.01); *H01L 2224/37011* (2013.01); *H01L 2224/37013* (2013.01); *H01L 2224/37124* (2013.01); *H01L 2224/37139* (2013.01); *H01L 2224/37144* (2013.01); *H01L 2224/37147* (2013.01); *H01L 2224/37611* (2013.01); *H01L 2224/4001* (2013.01); *H01L 2224/40095* (2013.01); *H01L 2224/4099* (2013.01); *H01L 2224/40227* (2013.01); *H01L 2224/40475* (2013.01); *H01L 2224/40499* (2013.01); *H01L 2224/4112* (2013.01); *H01L 2224/73263* (2013.01); *H01L 2224/8321* (2013.01); *H01L 2224/83192* (2013.01); *H01L 2224/83424* (2013.01); *H01L 2224/83447* (2013.01); *H01L 2224/83815* (2013.01); *H01L 2224/8421* (2013.01); *H01L 2224/84138* (2013.01); *H01L 2224/84424* (2013.01); *H01L 2224/84447* (2013.01); *H01L 2224/84815* (2013.01); *H01L 2224/9221* (2013.01); *H01L 2924/00015* (2013.01); *H01L 2924/1306* (2013.01); *H01L 2924/13055* (2013.01); *H01L 2924/13091* (2013.01); *H01L 2924/15724* (2013.01); *H01L 2924/19105* (2013.01); *H01L 2924/35121* (2013.01); *H01L 2924/365* (2013.01)

(58) Field of Classification Search
USPC ....... 257/139, 401, 676, 772, 678, 750, 666, 257/677, E23.031, E23.05, E21.506; 438/123
See application file for complete search history.

(56) References Cited

U.S. PATENT DOCUMENTS

| 2012/0248592 | A1 | 10/2012 | Hata et al. | |
|---|---|---|---|---|
| 2012/0313232 | A1* | 12/2012 | Zhang | H01L 21/565 257/676 |
| 2013/0258658 | A1* | 10/2013 | Hussell | H01L 25/0753 362/235 |
| 2015/0223343 | A1* | 8/2015 | Yamaki | H05K 1/188 361/761 |
| 2015/0270199 | A1* | 9/2015 | Sunaga | H01L 24/37 257/288 |
| 2015/0289369 | A1* | 10/2015 | Sunaga | H01L 23/3735 361/783 |
| 2015/0342074 | A1* | 11/2015 | Sunaga | H01L 23/3735 361/728 |

FOREIGN PATENT DOCUMENTS

| JP | 2006-114571 A | 4/2006 |
|---|---|---|
| JP | 2007-129327 A | 5/2007 |
| JP | 2008-16469 A | 1/2008 |
| JP | 2008-258649 A | 10/2008 |
| JP | 2011-243752 A | 12/2011 |
| JP | 2012-209402 A | 10/2012 |
| JP | 2012-212712 A | 11/2012 |
| JP | 2012-235010 A | 11/2012 |

OTHER PUBLICATIONS

Japanese-language Written Opinion (PCT/ISA/237) issued in PCT Application No. PCT/JP2014/005085 dated Jan. 13, 2015 (six pages).

International Preliminary Report on Patentability (PCT/IPEA/409) issued in PCT Application No. PCT/JP2014/005085 dated Aug. 28, 2015 (three pages).

English translation of document C3 (International Preliminary Report on Patentability (PCT/IPEA/409)) previously filed on Feb. 5, 2016 (three pages)).

Supplementary European Search Report issued in counterpart European Application No. 14855368.8 dated Sep. 5, 2016 (10 pages).

Paulasto, Mervi et al., "Reliability of Flip Chip Die Attach in Multichip Mechatronic Power Module", IEEE, 2000, pp. 93-100.

\* cited by examiner

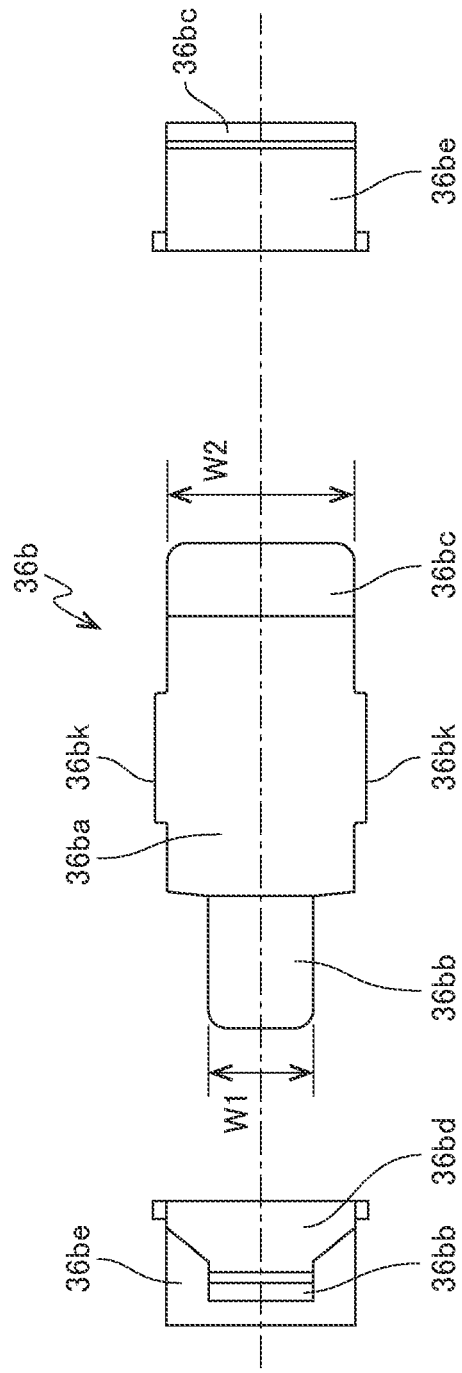

REFLOW

SEMICONDUCTOR MODULE

TECHNICAL FIELD

The present invention relates to a semiconductor module such as a power module incorporated into automotive electrical equipment.

BACKGROUND ART

In recent years, electronic devices have been introduced for controlling various electrical equipment in a vehicle such as an automobile. In an electric power steering apparatus as an example of electrical equipment into which an electronic device is incorporated, there is provided a motor drive unit in an enclosure accommodating an electric motor for steering an automobile and the electronic device is mounted on the motor drive unit. The electronic device is incorporated as a power module into the motor drive unit.

The power module is constituted as a so-called semiconductor module on which a power element such as a field effect transistor (FET) or an insulated gate bipolar transistor (IGBT) suitable for controlling electrical equipment driven with a relatively large current, such as an electric power steering apparatus, is mounted. Such a type of power module is also called "in-vehicle module", because it is mounted on a vehicle.

A power element is mounted on a substrate by solder jointing when manufacturing such a semiconductor module, and a technique for electrically connecting a semiconductor chip and a lead frame using an arch-shaped metal piece is disclosed in PTL 1 and 2. In other words, the arch-shaped metal piece is bridged between an electrode pad of the semiconductor chip and an inner lead portion of the lead frame, and the metal piece and the electrode pad of the semiconductor chip, and the metal piece and the inner lead portion of the lead frame are respectively solder-jointed, so that the semiconductor chip is mounted on the lead frame.

CITATION LIST

Patent Literature

PTL 1: JP 2011-243752 A
PTL 2: JP 2012-212712 A
PTL 3: JP 2006-114571 A

SUMMARY OF INVENTION

Technical Problem

However, in the technique disclosed in PTL 1 and 2, joint surfaces of the metal piece, and a surface to be jointed of the electrode pad of the semiconductor chip and a surface to be jointed of the inner lead portion of the lead frame are respectively parallel to each other. Thus, outgas generated from the molten solder during the solder jointing was easy to remain in the solder interposed between the joint surfaces and the surfaces to be jointed as air bubbles, and was difficult to be released from the solder. As a result, the void generation rate in the solder interposed between the joint surfaces and the surfaces to be jointed becomes high and the reliability of electric connection by a solder is decreased, thereby increasing the resistivity, and therefore, for example, when a high current of 100 A flows, problems such as overheating and igniting might be generated.

In a surface-mounting semiconductor device such as a thin quad flat package (TQFP), a technique for making it easy for outgas generated from a molten solder to be released from the solder during solder jointing of a lead for an external connection of the semiconductor device is disclosed in PTL 3. In other words, since tapered portions are provided on four surfaces (top surface, lower surface, and both side surfaces) of a lead tip such that the tip is tapered, air bubbles of the outgas generated from the molten solder during the solder jointing move toward the lead tip along the tapered portion on the lower surface while being combined with adjacent air bubbles on the tapered portion on the lower surface of the lead, and are released from the solder.

In addition, since the molten solder is easy to be wetted and spread along not only the tapered portion on the lower surface but also the tapered portions on the side surfaces of the lead and the surface of the side surfaces of the lead, and furthermore, is easy to be wetted and spread also on the tapered portion on the top surface of the lead, the solder is jointed to the whole of the four surfaces of the lead tip. As a result, the joint area becomes large, and the reliability of electric connection by a solder becomes high.

However, in the technique disclosed in PTL 3, since the tapered portions need to be provided by processing the four surfaces of the lead tip, there was a problem in that the manufacturing costs are increased.

Thus, an object of the present invention is to solve the above-described problems of the conventional arts and to provide a semiconductor module that has high reliability of electric connection by a solder and is inexpensive.

Solution to Problem

In order to solve the above-described problems, according to one embodiment of the present invention, there is provided a semiconductor module including: a substrate made of metal; an insulating layer formed on the substrate; a plurality of wiring patterns formed on the insulating layer; a bare-chip transistor mounted on one wiring pattern among the plurality of wiring patterns via a solder; and a metal plate connector formed of a metal plate, the metal plate connector jointing an electrode formed on a top surface of the bare-chip transistor and another wiring pattern among the plurality of wiring patterns.

The metal plate connector includes a flat plate portion, an electrode-jointing portion that is arranged on one end side of the flat plate portion in one direction and is jointed to the electrode of the bare-chip transistor via a solder, a substrate-jointing portion that is arranged on the other end side of the flat plate portion in the one direction and is jointed to the another wiring pattern via a solder, a first coupling portion that extends downward from the one end of the flat plate portion in the one direction and couples the one end of the flat plate portion in the one direction to one end of the electrode-jointing portion, and a second coupling portion that extends downward from the other end of the flat plate portion in the one direction and couples the other end of the flat plate portion in the one direction to one end of the substrate-jointing portion to form a bridge shape.

In addition, the electrode-jointing portion is formed to be bent from the first coupling portion and extend outward in the one direction and the substrate-jointing portion is formed to be bent from the second coupling portion and extend outward in the one direction.

Then, a joint surface of the electrode-jointing portion that is opposed to a surface to be jointed of the electrode of the bare-chip transistor and a joint surface of the substrate-jointing portion that is opposed to a surface to be jointed of the another wiring pattern include an outgas releasing mechanism that makes outgas generated from a molten solder during solder jointing of the metal plate connector be released from the solders interposed between the joint surfaces and the surfaces to be jointed.

In addition, according to another embodiment of the present invention, there is provided a semiconductor module including: a substrate made of metal; an insulating layer formed on the substrate; a plurality of wiring patterns formed on the insulating layer; a bare-chip transistor mounted on one wiring pattern among the plurality of wiring patterns via a solder; and a metal plate connector formed of a metal plate, the metal plate connector jointing an electrode formed on a top surface of the bare-chip transistor and another wiring pattern among the plurality of wiring patterns.

The metal plate connector includes a flat plate portion, an electrode-jointing portion that is arranged on one end side of the flat plate portion in one direction and is jointed to the electrode of the bare-chip transistor via a solder, a substrate-jointing portion that is arranged on the other end side of the flat plate portion in the one direction and is jointed to the another wiring pattern via a solder, a first coupling portion that extends downward from the one end of the flat plate portion in the one direction and couples the one end of the flat plate portion in the one direction to one end of the electrode-jointing portion, and a second coupling portion that extends downward from the other end of the flat plate portion in the one direction and couples the other end of the flat plate portion in the one direction to one end of the substrate-jointing portion to form a bridge shape.

In addition, the electrode-jointing portion is formed to be bent from the first coupling portion and extend outward in the one direction, and is formed such that a distance from the flat plate portion in a direction perpendicular to the flat plate portion is, compared to at the one end of the electrode-jointing portion, larger at the other end, such that a joint surface of the electrode-jointing portion is inclined with respect to a surface to be jointed of the electrode of the bare-chip transistor, which is opposed to the joint surface.

Furthermore, the substrate-jointing portion is formed to be bent from the second coupling portion and extend outward in the one direction, and is formed such that the distance from the flat plate portion in the direction perpendicular to the flat plate portion is, compared to at the one end of the substrate-jointing portion, larger at the other end, such that a joint surface of the substrate-jointing portion is inclined with respect to a surface to be jointed of the another wiring pattern, which is opposed to the joint surface.

In the semiconductor module according to the another embodiment, an inclination angle between the joint surface of the electrode-jointing portion and the surface to be jointed of the electrode of the bare-chip transistor and an inclination angle between the joint surface of the substrate-jointing portion and the surface to be jointed of the another wiring pattern may be 0.5° or more and 7.5° or less.

In addition, in the semiconductor module according to the one embodiment and the semiconductor module according to the another embodiment, a width of the electrode-jointing portion in a direction perpendicular to the one direction may be narrower than a width of the substrate-jointing portion in the direction perpendicular to the one direction.

Furthermore, in the semiconductor module according to the one embodiment and the semiconductor module according to the another embodiment, at both ends of the flat plate portion in a direction perpendicular to the one direction, balancing rib portions may be respectively formed to be bent down from the both ends.

Furthermore, in the semiconductor module according to the one embodiment and the semiconductor module according to the another embodiment, thicknesses of the electrode-jointing portion and the substrate-jointing portion may be larger than a thickness of another portion of the metal plate connector.

Furthermore, in the semiconductor module according to the one embodiment and the semiconductor module according to the another embodiment, wherein a thickness of the flat plate portion may be larger than a thickness of another portion of the metal plate connector.

Advantageous Effects of Invention

According to embodiments of the present invention, there is provided a semiconductor module that has high reliability of electric connection by a solder and is inexpensive.

BRIEF DESCRIPTION OF DRAWINGS

FIG. 10A is a plan view of the metal plate connector of FIG. 9;

FIG. 10B is a front view of the metal plate connector of FIG. 9;

FIG. 10C is a rear view of the metal plate connector of FIG. 9;

DESCRIPTION OF EMBODIMENTS

Figure 1:
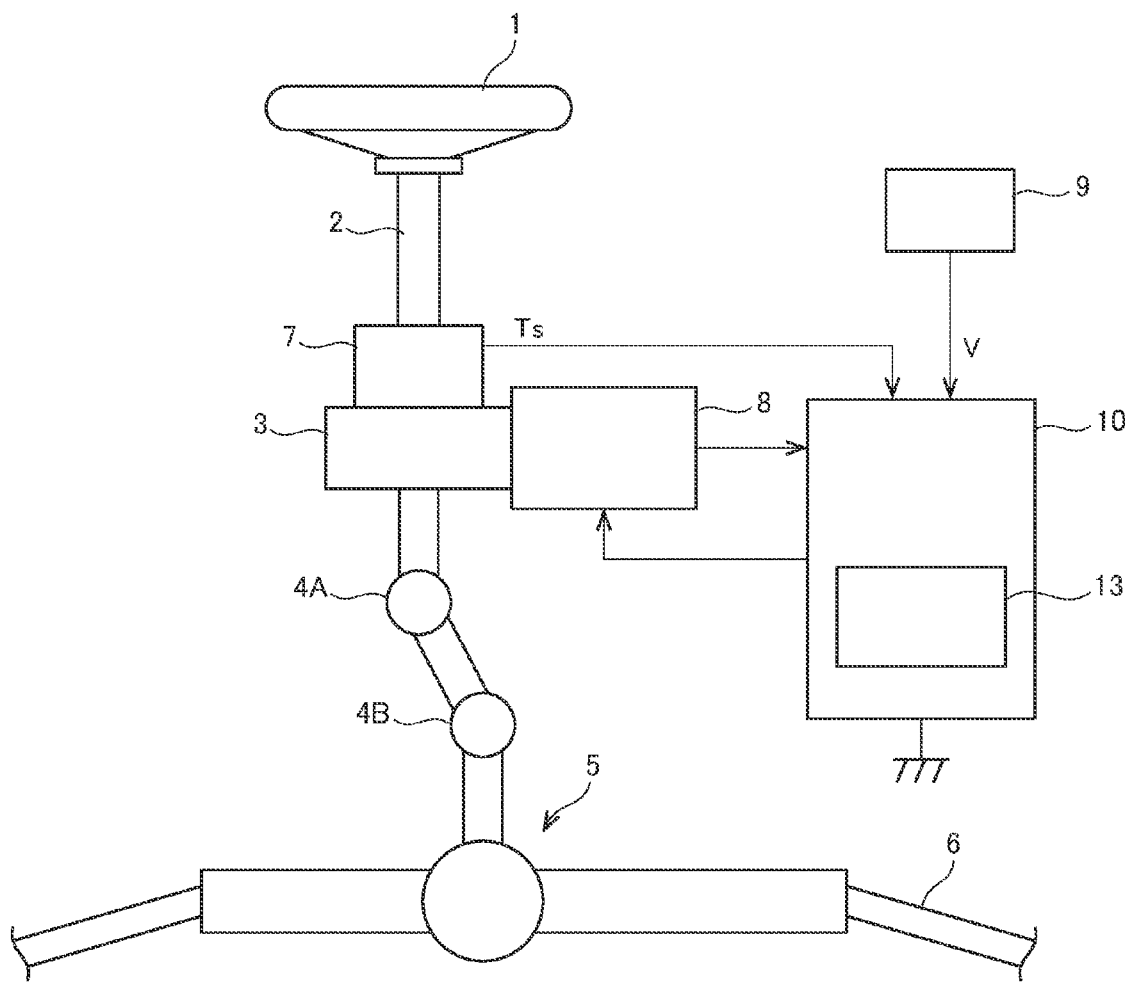
FIG. 1 is a diagram illustrating a basic structure of an electric power steering apparatus employing a semiconductor module according to one embodiment of the present invention.
Figure 2:
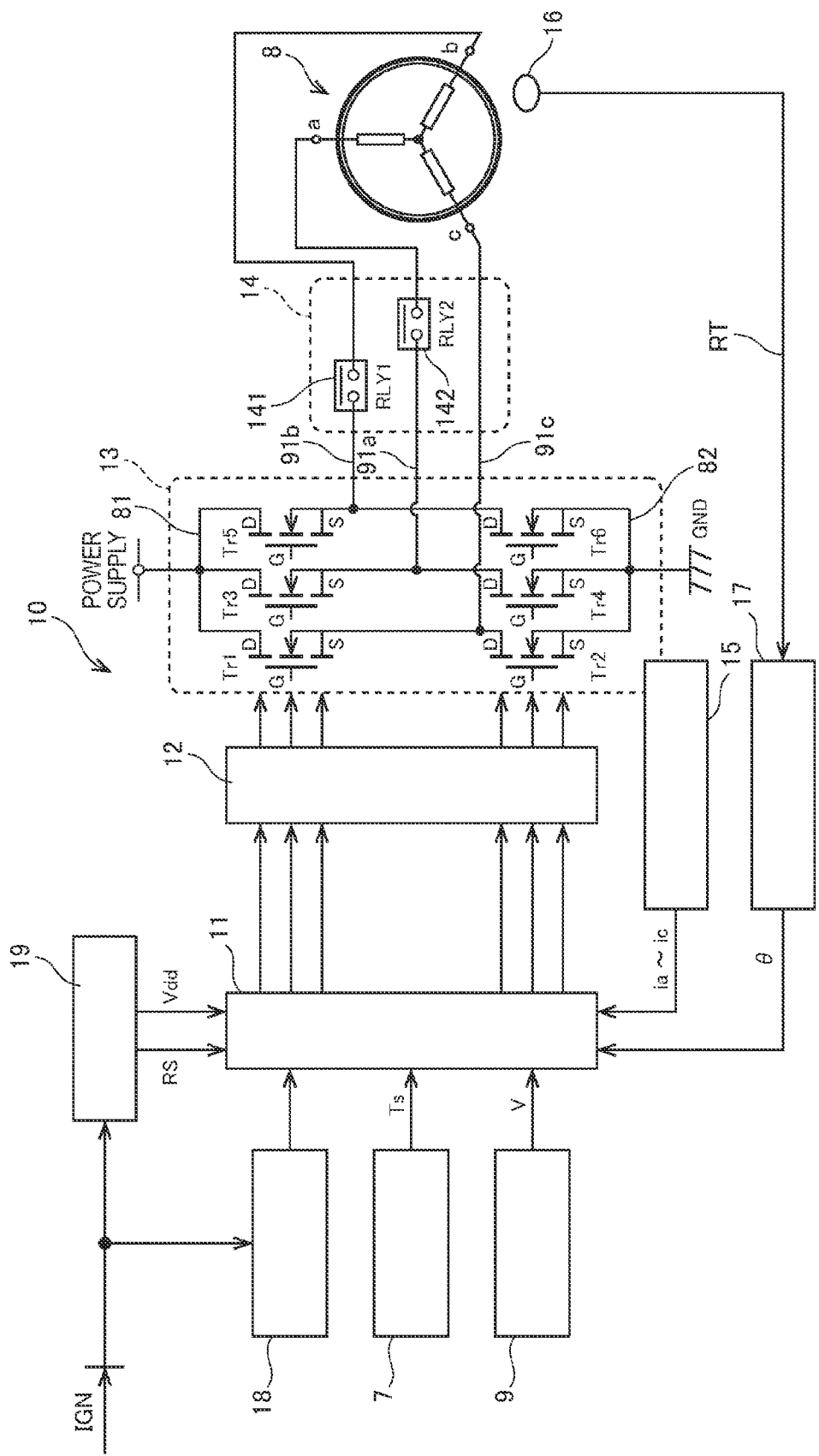
FIG. 2 is a block diagram illustrating a control system of a controller of the electric power steering apparatus illustrated in FIG. 1.
Figure 3:
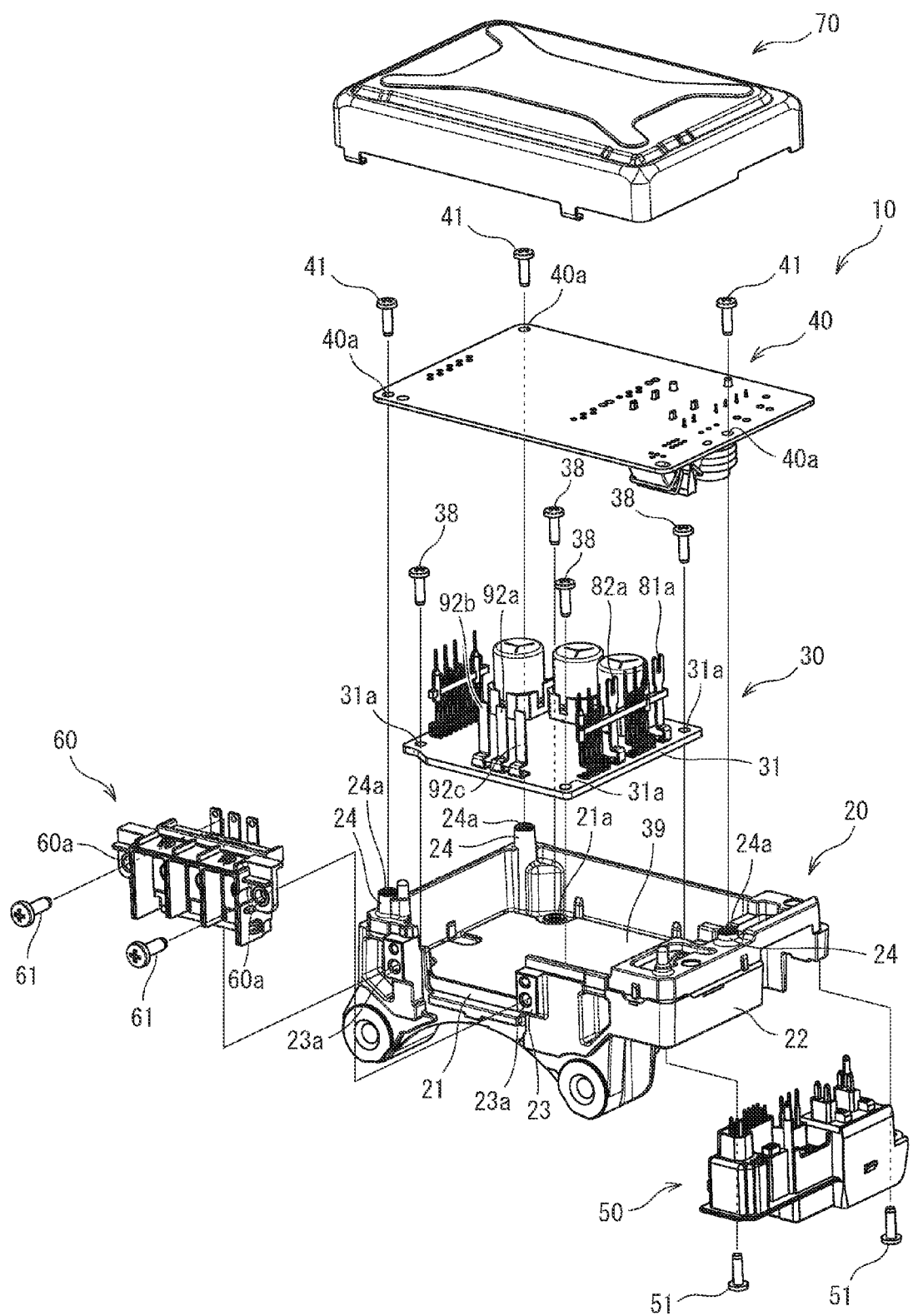
FIG. 3 is an exploded perspective view of the controller including the semiconductor module of the electric power steering apparatus illustrated in FIG. 1.
Figure 4:
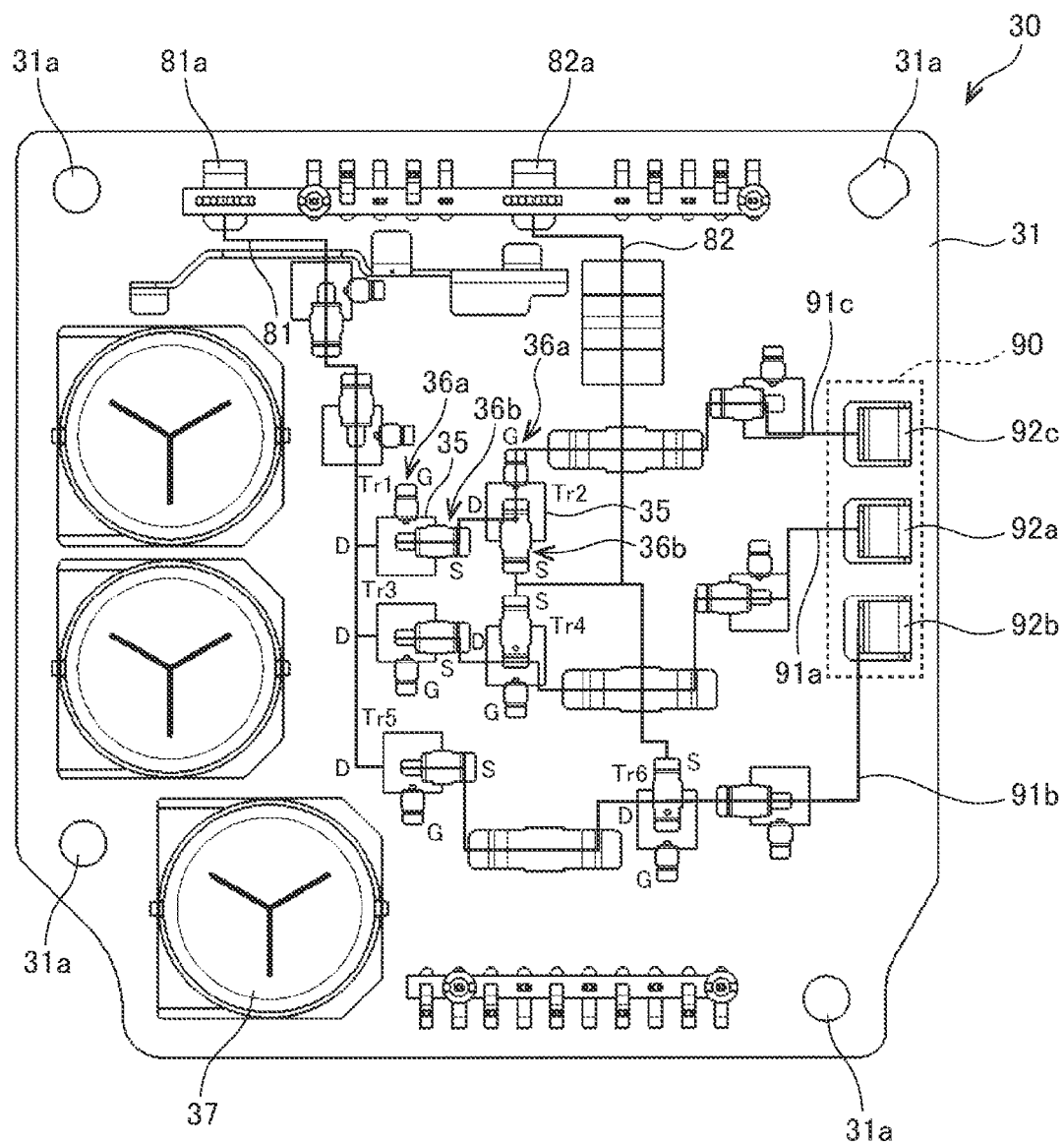
FIG. 4 is a plan view of the semiconductor module illustrated in FIG. 3.

Embodiments of the present invention will be described in detail with reference to the drawings. FIG. 1 is a diagram illustrating a basic structure of an electric power steering apparatus employing a semiconductor module according to one embodiment of the present invention. FIG. 2 is a block diagram illustrating a control system of a controller of the electric power steering apparatus illustrated in FIG. 1. FIG. 3 is an exploded perspective view of the controller including the semiconductor module of the electric power steering apparatus illustrated in FIG. 1. FIG. 4 is a plan view of the semiconductor module illustrated in FIG. 3.

Figure 5:
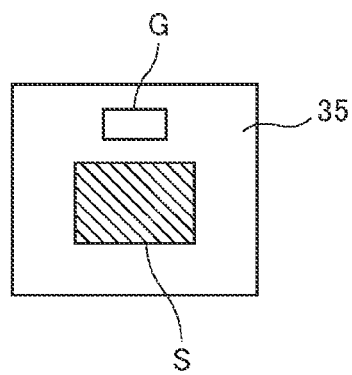
FIG. 5 is a schematic plan view of a bare-chip FET as a bare-chip transistor.
Figure 6:
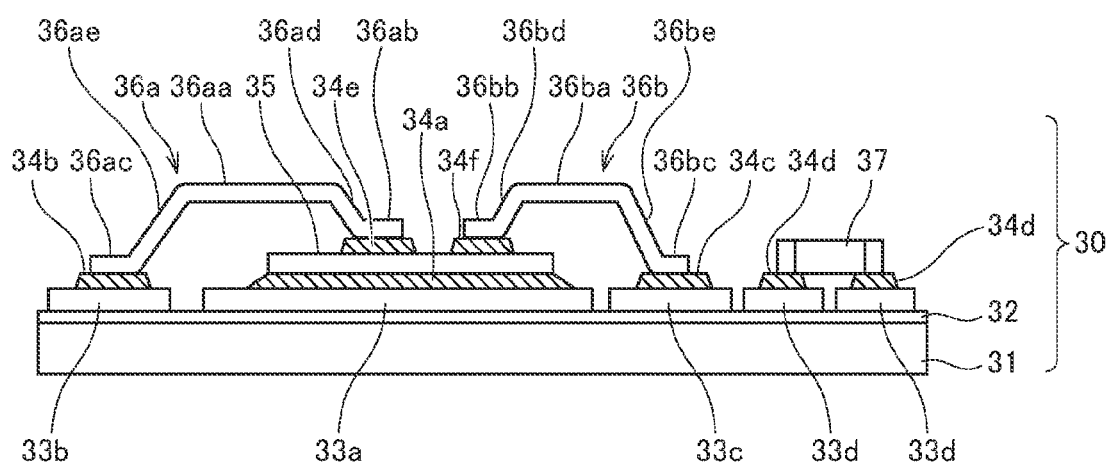
FIG. 6 is a schematic diagram for describing a joint state between electrodes of the bare-chip FET and wiring patterns on a substrate in the semiconductor module illustrated in FIG. 3 and FIG. 4.
Figure 7:
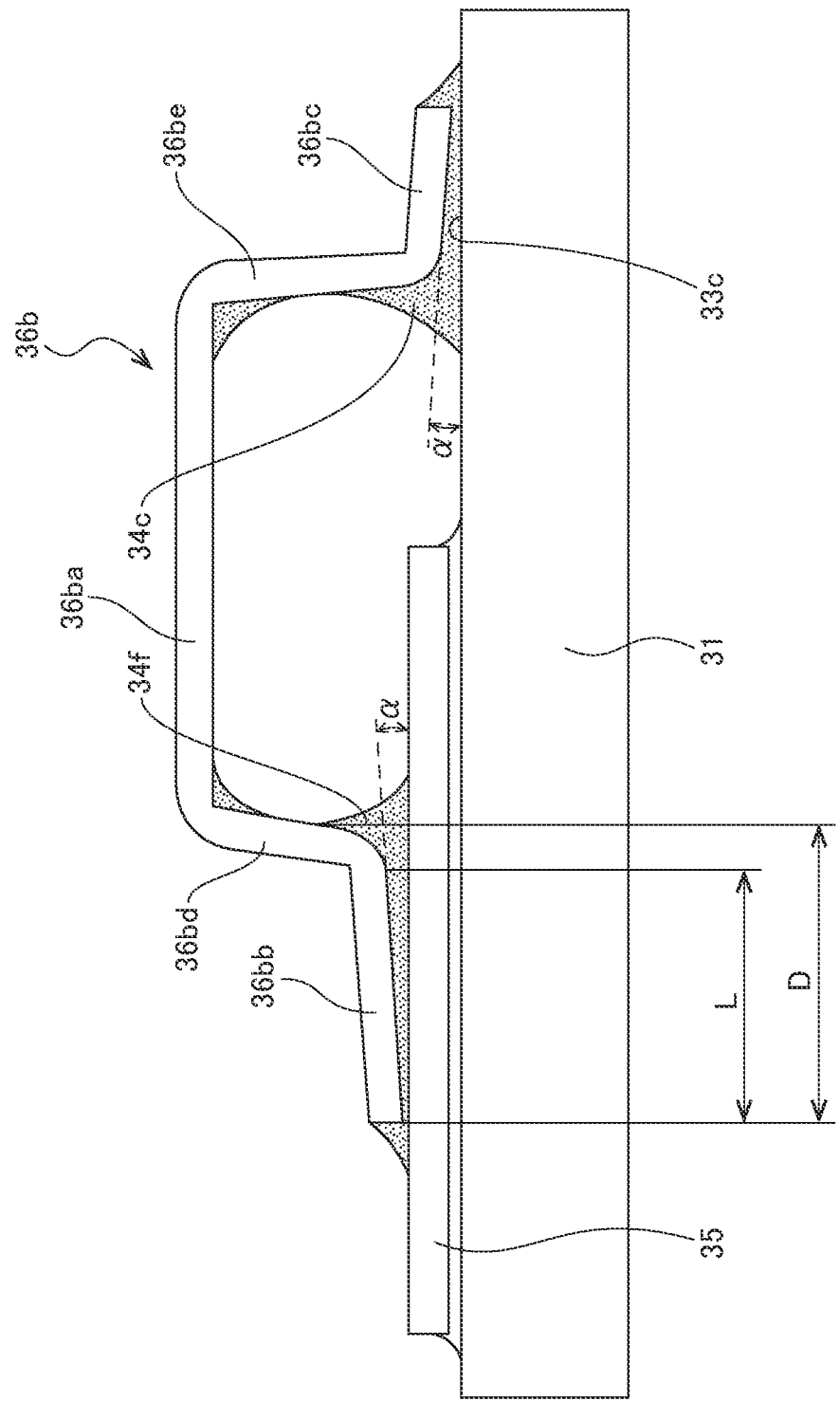
FIG. 7 is a schematic diagram describing inclination angles between joint surfaces and surfaces to be jointed of an electrode-jointing portion and a substrate-jointing portion of a metal plate connector.

FIG. 5 is a schematic plan view of a bare-chip FET as a bare-chip transistor. FIG. 6 is a schematic diagram for describing a joint state between electrodes of the bare-chip FET and wiring patterns on a substrate in the semiconductor module illustrated in FIG. 3 and FIG. 4. FIG. 7 is a schematic diagram for describing inclination angles between joint surfaces and surfaces to be jointed of an electrode-jointing portion and a substrate-jointing portion of a gate-electrode metal plate connector.

In the electric power steering apparatus of FIG. 1, a column shaft 2 of a steering wheel 1 is connected to tie rods 6 of steered wheels via a reduction gear 3, universal joints 4A and 4B, and a rack and pinion mechanism 5. The column shaft 2 is provided with a torque sensor 7 for detecting the steering torque of the steering wheel 1, and an electric motor 8 for outputting the assist torque that assists the steering torque of the steering wheel 1 is connected to the column shaft 2 via the reduction gear 3.

A controller 10 that controls the electric power steering apparatus is supplied with electric power from a battery, not illustrated, and receives an ignition key signal IGN (see FIG. 2) via an ignition key, not illustrated. The controller 10 calculates a steering assist command value as an assist (steering assist) command on the basis of a steering torque Ts detected by the torque sensor 7 and a vehicle velocity V detected by a vehicle velocity sensor 9, determines a current supplied to the electric motor 8 on the basis of the calculated steering assist command value, and controls the assist torque that the electric motor 8 outputs.

The controller 10 is mainly constituted of a microcomputer, and the mechanism and configuration of the controlling apparatus thereof are illustrated in FIG. 2.

The steering torque Ts detected by the torque sensor 7 and the vehicle velocity V detected by the vehicle velocity sensor 9 are received by a control calculating device 11 as a control calculating unit, and a current command value calculated by the control calculating device 11 is received by a gate drive circuit 12. A gate drive signal formed by the gate drive circuit 12 based on the current command value and the like is received by a motor drive unit 13 including a bridge configuration of FETs. The motor drive unit 13 drives the electric motor 8 constituted of a three-phase brushless motor via a breaker device 14 for emergency stop.

Each of phase currents of the three-phase brushless motor is detected by a current detecting circuit 15. The detected three-phase motor currents is to is are received by the control calculating device 11 as feedback currents. In addition, the three-phase brushless motor is equipped with a rotation sensor 16 such as a Hall sensor. A rotation signal RT from the rotation sensor 16 is received by a rotor position detecting circuit 17 and the detected rotation position θ is received by the control calculating device 11.

Additionally, the ignition key signal IGN from the ignition key is received by an ignition voltage monitoring unit 18 and a power supply circuit unit 19. Power-supply voltage Vdd from the power supply circuit unit 19 is received by the control calculating device 11 and a reset signal Rs for stopping the apparatus is received by the control calculating device 11. The breaker device 14 is constituted of relay contacts 141 and 142 for breaking two phases.

Additionally, the circuit configuration of the motor drive unit 13 will be described later. A serial connection of FETs Tr1 and Tr2, a serial connection of FETs Tr3 and Tr4, and a serial connection of FETs Tr5 and Tr6 are connected to a power supply line 81. The FETs Tr1, Tr3, and Tr5 are connected in parallel to the power supply line 81, and the FETs Tr2, Tr4, and Tr6 are connected in parallel to a ground line 82. Such a configuration constitutes an inverter.

In such a configuration, in the FETs Tr1 and Tr2, the source electrode S of the FET Tr1 and the drain electrode D of the FET Tr2 are connected in series to constitute a c-phase arm of the three-phase motor, and a current is output at a c-phase output line 91c. In the FETs Tr3 and Tr4, the source electrode S of the FET Tr3 and the drain electrode D of the FET Tr4 are connected in series to constitute an a-phase arm of the three-phase motor, and a current is output at an a-phase output line 91a. In the FETs Tr5 and Tr6, the source electrode S of the FET Tr5 and the drain electrode D of the FET Tr6 are connected in series to constitute a b-phase arm of the three-phase motor, and a current is output at a b-phase output line 91b.

Next, FIG. 3 is an exploded perspective view of the controller 10 including the semiconductor module of the electric power steering apparatus illustrated in FIG. 1. The controller 10 includes a case 20, a semiconductor module 30 as a power module including the motor drive unit 13, a heat-dissipating sheet 39, a control circuit board 40 including the control calculating device 11 and the gate drive circuit 12, a power/signal connector 50, a three-phase output connector 60, and a cover 70.

Here, the case 20 is formed to have a substantially rectangular shape and includes a tabular semiconductor module placement section 21 on which the semiconductor module 30 is placed, a power/signal connector mounting section 22 arranged at an end part in a length direction of the semiconductor module placement section 21 so as to mount the power/signal connector 50 thereon, and a three-phase output connector mounting section 23 arranged at an end in a width direction of the semiconductor module placement section 21 so as to mount the three-phase output connector 60 thereon.

Additionally, plural screw holes 21a into which attachment screws 38 for attaching the semiconductor module 30 are screwed are formed on the semiconductor module placement section 21. The semiconductor module placement section 21 and the power/signal connector mounting section 22 are provided with plural attachment posts 24 vertically standing for attaching the control circuit board 40. Screw holes 24a into which attachment screws 41 for attaching the control circuit board 40 are screwed are formed on the attachment posts 24, respectively. Furthermore, plural screw holes 23a into which attachment screws 61 for attaching the three-phase output connector 60 are screwed are formed on the three-phase output connector mounting section 23.

In addition, the semiconductor module 30 has the circuit configuration of the motor drive unit 13 described above. As illustrated in FIG. 4, the six FETs Tr1 to Tr6, a positive electrode terminal 81a connected to the power supply line 81, and a negative electrode terminal 82a connected to the ground line 82 are mounted on a substrate 31. A three-phase output portion 90 including an a-phase output terminal 92a connected to the a-phase output line 91a, a b-phase output terminal 92b connected to the b-phase output line 91b, and a c-phase output terminal 92c connected to the c-phase output line 91c is mounted on the substrate 31. Other substrate-mounted components 37 including a capacitor are mounted on the substrate 31. Furthermore, plural through-holes 31a into which attachment screws 38 for attaching the semiconductor module 30 are inserted are formed on the substrate 31 of the semiconductor module 30.

Here, the mounting of the six FETs Tr1 to Tr6 on the substrate 31 in the semiconductor module 30 will be described later. Each of the FETs Tr1 to Tr6 is constituted of a bare-chip FET (bare-chip transistor) 35 and includes a source electrode S and a gate electrode G on the bare-chip FET 35 as illustrated in FIG. 5, and includes a drain electrode, not illustrated, on the lower surface of the bare-chip FET 35.

The gate electrode G and the source electrode S formed on the top surface of the bare-chip FET 35 are arranged straightly in series in the up-down direction in FIG. 5, as illustrated in FIG. 5. The gate electrode G has a rectangular shape having a short side extending in the up-down direction in FIG. 5 and a long side perpendicular to the short side. The source electrode S has a rectangular shape having a short side extending in the up-down direction in FIG. 5 and a long side perpendicular to the short side. The short side and the long side of the source electrode S are larger than the short side and the long side of the gate electrode G, respectively, and the area of the source electrode S is greater than the area of the gate electrode G.

As illustrated in FIG. 6, the semiconductor module 30 includes the substrate 31 made of metal, and an insulating layer 32 is formed on the substrate 31. The substrate 31 is made of metal such as aluminum. In addition, plural wiring patterns 33a to 33d are formed on the insulating layer 32. Each of the wiring patterns 33a to 33d is made of metal such as copper or aluminum or alloy containing these kinds of metal.

The bare-chip FET 35 constituting each of the FETs Tr1 to Tr6 is mounted via a solder 34a on one wiring pattern 33a among the plural wiring patterns 33a to 33d. The drain electrode formed on the lower surface of the bare-chip FET 35 is jointed to the wiring pattern 33a via the solder 34a. The source electrode S of the bare-chip FET 35 and another wiring pattern 33b among the plural wiring patterns 33a to 33d are jointed together via solders 34e and 34b, respectively, by a source-electrode metal plate connector 36a. In addition, the gate electrode G of the bare-chip FET 35 and still another wiring pattern 33c among the plural wiring patterns 33a to 33d are jointed together via solders 34f and 34c, respectively, by a gate-electrode metal plate connector 36b.

Additionally, the other substrate-mounted component 37, such as a capacitor, is mounted via a solder 34d on a yet still another wiring pattern 33d among the plural wiring patterns 33a to 33d formed on the insulating layer 32.

The semiconductor module 30 configured in this way, as illustrated in FIG. 3, is attached on the semiconductor module placement section 21 of the case 20 by the plural attachment screws 38. Plural through-holes 31a through which the attachment screws 38 are inserted are formed on the substrate 31 of the semiconductor module 30.

In addition, when the semiconductor module 30 is attached on the semiconductor module placement section 21, the heat-dissipating sheet 39 is attached on the semiconductor module placement section 21, and the semiconductor module 30 is attached on the heat-dissipating sheet 39. The heat-dissipating sheet 39 allows the heat generated in the semiconductor module 30 to be dissipated to the case 20 via the heat-dissipating sheet 39.

Additionally, a control circuit including the control calculating device 11 and the gate drive circuit 12 is constructed by mounting plural electronic components on the control circuit board 40. After the semiconductor module 30 is attached onto the semiconductor module placement section 21, the control circuit board 40 is attached onto the plural attachment posts 24 vertically standing on the semiconductor module placement section 21 and the power/signal connector mounting section 22 with the plural attachment screws 41 from the upper side of the semiconductor module 30. Plural through-holes 40a into which the attachment screws 41 are inserted are formed in the control circuit board 40.

Additionally, the power/signal connector 50 is used to supply DC power from a battery (not illustrated) to the semiconductor module 30 and to receive various signals including signals from the torque sensor 7 and the vehicle velocity sensor 9 by the control circuit board 40. The power/signal connector 50 is attached onto the power/signal connector mounting section 22 arranged on the semiconductor module placement section 21 with plural attachment screws 51.

The three-phase output connector 60 is used to output currents from the a-phase output terminal 92a, the b-phase output terminal 92b, and the c-phase output terminal 92c. The three-phase output connector 60 is attached onto the three-phase output connector mounting section 23 arranged at an end of the semiconductor module placement section 21 in the width direction with plural attachment screws 61. Plural through-holes 60a into which the attachment screws 61 are inserted are formed in the three-phase output connector 60.

Furthermore, the cover 70 is attached onto the case 20 to which the semiconductor module 30, the control circuit board 40, the power/signal connector 50, and the three-phase output connector 60 are attached so as to cover the control circuit board 40 from the above of the control circuit board 40.

Here, the gate-electrode metal plate connector 36b is formed by punching and bending, that is, by press forming a metal plate composed of a material having both stiffness and high electric conductivity, such as copper (Cu), silver (Ag), gold (Au), copper alloy, and an aluminum alloy conductor.

As illustrated in FIG. 6 and FIG. 7, the gate-electrode metal plate connector 36b includes a flat plate portion 36ba, an electrode-jointing portion 36bb that is arranged on one end side of the flat plate portion 36ba in one direction (right-and-left direction in FIG. 6 and FIG. 7) and is jointed to the gate electrode G of the bare-chip FET 35 via the solder 34f, a substrate-jointing portion 36bc that is arranged on the other end side of the flat plate portion 36*ba* in the one direction and is jointed to the wiring pattern 33*c* via the solder 34*c*, a first coupling portion 36*bd* that extends downward from the one end of the flat plate portion 36*ba* in the one direction and couples the one end of the flat plate portion 36*ba* in the one direction to one end of the electrode-jointing portion 36*bb*, and a second coupling portion 36*be* that extends downward from the other end of the flat plate portion 36*ba* in the one direction and couples the other end of the flat plate portion 36*ba* in the one direction to one end of the substrate-jointing portion 36*bc* to form a bridge shape. In other words, the substrate-jointing portion 36*bc* is arranged so as to be opposed to the electrode-jointing portion 36*bb* in the one direction (right-and-left direction in FIG. 6 and FIG. 7).

Furthermore, the electrode-jointing portion 36*bb* is formed to be bent from the first coupling portion 36*bd* and extend outward in the one direction. In addition, the electrode-jointing portion 36*bb* is formed such that a distance from the flat plate portion 36*ba* in a direction perpendicular to the flat plate portion 36*ba* (up-down direction in FIG. 6 and FIG. 7) is, compared to at one end (proximal end) of the electrode-jointing portion 36*bb*, larger at the other end (distal end). Thus, as illustrated in FIG. 7, a joint surface (lower surface) of the electrode-jointing portion 36*bb* is inclined with respect to a surface to be jointed of the gate electrode G of the bare-chip FET 35, which is opposed to the joint surface (inclined downward in FIG. 6 and FIG. 7).

Furthermore, the substrate-jointing portion 36*bc* is formed to be bent from the second coupling portion 36*be* and extend outward in the one direction. In addition, the substrate-jointing portion 36*bc* is formed such that the distance from the flat plate portion 36*ba* in the direction perpendicular to the flat plate portion 36*ba* (up-down direction in FIG. 6 and FIG. 7) is, compared to at one end (proximal end) of the substrate-jointing portion 36*bc*, larger at the other end (distal end). Thus, as illustrated in FIG. 7, a joint surface (lower surface) of the substrate-jointing portion 36*bc* is inclined with respect to a surface to be jointed of the wiring pattern 33*c*, which is opposed to the joint surface (inclined downward in FIG. 6 and FIG. 7).

An inclination angle α between the joint surface of the electrode-jointing portion 36*bb* and the surface to be jointed of the gate electrode G of the bare-chip FET 35 and an inclination angle α between the joint surface of the substrate-jointing portion 36*bc* and the surface to be jointed of the wiring pattern 33*c* are not particularly limited, and are preferably 0.5° or more and 7.5° or less, more preferably 2° or more and 6° or less, and particularly preferably 4°.

On the other hand, the source-electrode metal plate connector 36*a* is formed by punching and bending, that is, by press forming a metal plate composed of a material having both stiffness and high electric conductivity, such as copper (Cu), silver (Ag), gold (Au), copper alloy, and an aluminum alloy conductor, as is the case with the gate-electrode metal plate connector 36*b*.

As illustrated in FIG. 6, the source-electrode metal plate connector 36*a* includes a flat plate portion 36*aa*, an electrode-jointing portion 36*ab* that is arranged on one end side of the flat plate portion 36*aa* in one direction (right-and-left direction in FIG. 6) and is jointed to the source electrode S of the bare-chip FET 35 via the solder 34*e*, a substrate-jointing portion 36*ac* that is arranged on the other end side of the flat plate portion 36*aa* in the one direction and is jointed to the wiring pattern 33*b* via the solder 34*b*, a first coupling portion 36*ad* that extends downward from the one end of the flat plate portion 36*aa* in the one direction and couples the one end of the flat plate portion 36*aa* in the one direction to one end of the electrode-jointing portion 36*ab*, and a second coupling portion 36*ae* that extends downward from the other end of the flat plate portion 36*aa* in the one direction and couples the other end of the flat plate portion 36*aa* in the one direction to one end of the substrate-jointing portion 36*ac* to form a bridge shape. In other words, the substrate-jointing portion 36*ac* is arranged so as to be opposed to the electrode-jointing portion 36*ab* in the one direction (right-and-left direction in FIG. 6).

Furthermore, the electrode-jointing portion 36*ab* is formed to be bent from the first coupling portion 36*ad* and extend outward in the one direction. In addition, the electrode-jointing portion 36*ab* is formed such that a distance from the flat plate portion 36*aa* in a direction perpendicular to the flat plate portion 36*aa* (up-down direction in FIG. 6) is, compared to at one end (proximal end) of the electrode-jointing portion 36*ab*, larger at the other end (distal end). Thus, a joint surface (lower surface) of the electrode-jointing portion 36*ab* is inclined with respect to a surface to be jointed of the source electrode S of the bare-chip FET 35, which is opposed to the joint surface (inclined downward in FIG. 6).

Furthermore, the substrate-jointing portion 36*ac* is formed to be bent from the second coupling portion 36*ae* and extend outward in the one direction. In addition, the substrate-jointing portion 36*ac* is formed such that the distance from the flat plate portion 36*aa* in the direction perpendicular to the flat plate portion 36*aa* (up-down direction in FIG. 6) is, compared to at one end (proximal end) of the substrate-jointing portion 36*ac*, larger at the other end (distal end). Thus, a joint surface (lower surface) of the substrate-jointing portion 36*ac* is inclined with respect to a surface to be jointed of the wiring pattern 33*b*, which is opposed to the joint surface (inclined downward in FIG. 6).

An inclination angle α between the joint surface of the electrode-jointing portion 36*ab* and the surface to be jointed of the source electrode S of the bare-chip FET 35 and an inclination angle α between the joint surface of the substrate-jointing portion 36*ac* and the surface to be jointed of the wiring pattern 33*b* are not particularly limited, and are preferably 0.5° or more and 7.5° or less, more preferably 2° or more and 6° or less, and particularly preferably 4°.

In this way, since the joint surfaces of the electrode-jointing portions 36*ab* and 36*bb* are inclined with respect to the surfaces to be jointed of the electrodes S and G of the bare-chip FET 35, which are opposed to the joint surfaces, and the joint surfaces of the substrate-jointing portions 36*ac* and 36*bc* are inclined with respect to the surfaces to be jointed of the wiring patterns 33*b* and 33*c*, which are opposed to the joint surfaces, air bubbles of outgas generated from the molten solder during solder jointing of the both-electrodes metal plate connectors 36*a* and 36*b* are easy to be released from the solder interposed between the joint surfaces and the surfaces to be jointed.

In other words, the air bubbles of the outgas generated from the molten solder move obliquely upward along the inclined joint surfaces while being combined with adjacent air bubbles, and thus are easy to be released from the solder. Furthermore, since the molten solder flows along the first coupling portions 36*ad* and 36*bd* and the second coupling portions 36*ae* and 36*be* to the lower surfaces of the flat plate portions 36*aa* and 36*ba* by a permeating and wetting phenomenon during the solder jointing (see FIG. 7), the air bubbles move in association with the flowing of the solder and the air bubbles are made easier to be released from the solder interposed between the joint surfaces and the surfaces to be jointed.

In particular, when the solder jointing of the both-electrodes metal plate connectors 36a and 36b is performed in a reflow furnace, the flowing of the solder to the flat plate portions 36aa and 36ba is easier to occur for the following reason. Since the temperature in the reflow furnace is higher at a higher position, in the both-electrodes metal plate connectors 36a and 36b in the reflow furnace, the flat plate portions 36aa and 36ba positioned on the upper side are higher in temperature than the electrode-jointing portions 36ab and 36bb and the substrate-jointing portions 36ac and 36bc positioned on the lower side. Generally, a solder tends to flow from a lower-temperature region to a higher-temperature region, and thus, in the both-electrodes metal plate connectors 36a and 36b in the reflow furnace, the solder is easy to flow from the low-temperature electrode-jointing portions 36ab and 36bb and substrate-jointing portions 36ac and 36bc to the high-temperature flat plate portions 36aa and 36ba.

In this way, by using at the same time three points, in addition to the inclinations of the joint surfaces of the electrode-jointing portions 36ab and 36bb and the substrate-jointing portions 36ac and 36bc, the permeating and wetting phenomenon of the solder, and the temperature distribution of the both-electrodes metal plate connectors 36a and 36b, the air bubbles are extremely easy to be released from the solder.

As a result, the void generation rate in the solder interposed between the joint surfaces and the surfaces to be jointed is kept low, and thus the reliability of electric connection by a solder becomes high and the resistivity of the solder jointing portion becomes low. Therefore, for example, even when a high current of 100 A flows into the solder jointing portion, problems such as overheating and igniting are difficult to be generated.

Contrary to the present embodiment, when the electrode-jointing portions 36ab and 36bb are formed such that the distances from the flat plate portions 33aa and 36ba in the directions perpendicular to the flat plate portions 33aa and 36ba are, compared to at one end of the electrode-jointing portions 36ab and 36bb, smaller at the other end, and the substrate-jointing portions 36ac and 36bc are formed such that the distances from the flat plate portions 33aa and 36ba in the directions perpendicular to the flat plate portions 33aa and 36ba are, compared to at one end of the substrate-jointing portions 36ac and 36bc, smaller at the other end (in other words, the inclination direction is opposite from that in the present embodiment, and the joint surfaces are inclined upward in FIG. 6 and FIG. 7), the above-described effect of making the air bubbles easier to be released by the flowing of the solder is hardly obtained. In other words, the molten solder hardly flows to the lower surfaces of the flat plate portions 36aa and 36ba, and thus the above-described effect of making the air bubbles easier to be released by the flowing of the solder is hardly obtained.

Furthermore, the foregoing source-electrode metal plate connector 36a and gate-electrode metal plate connector 36b can be easily formed by press forming a metal plate, and thus the semiconductor module 30 of the present embodiment can be manufactured at a low cost.

The inclination angle α is preferably 0.5° or more and 7.5° or less as described above, and when the inclination angle α is less than 0.5°, the air bubbles become difficult to be released from the solder interposed between the joint surface and the surface to be jointed. As a result, the void generation rate becomes high and the reliability of electric connection by a solder becomes insufficient, and thus, for example, when a high current of 100 A flows into the solder jointing portion, problems such as overheating and igniting may be generated.

On the other hand, when the inclination angle α is more than 7.5°, the joint area between the joint surface and the surface to be jointed by the solder becomes small, and thus, for example, when a high current of 100 A flows into the solder jointing portion, problems such as overheating and igniting may be generated. In addition, the strength of the solder jointing portion may become insufficient. In detail, since a distance (gap) between the joint surface and the surface to be jointed becomes large when the inclination angle α is large, the spatial volume of the gap that is to be jointed by the solder becomes large. However, since the application quantity (supply quantity) of the solder to the jointing portion is fixed when the solder jointing is performed by reflow, for example, the joint area between the joint surface and the surface to be jointed by the solder becomes small. Therefore, the strength of the solder jointing portion may become insufficient.

Similarly, when the inclination angle α is large, a minimum joint length D of the solder (length in the one direction, see FIG. 7) becomes small. Therefore, when the inclination angle α is more than 7.5°, a finishing state of the solder may not satisfy acceptable standards of IPC-A-610 that provides quality acceptable conditions of electronic assemblies.

Provisions of IPC-A-610 are as follows. When the length of each of the electrode-jointing portions 36ab and 36bb and the substrate-jointing portions 36ac and 36bc in the one direction (right-and-left direction in FIG. 7) is L, the minimum joint length of the solder (length in the one direction) is D, and the minimum width of each of the electrode-jointing portions 36ab and 36bb and the substrate-jointing portions 36ac and 36bc (length in a direction perpendicular to the one direction) is W, D>0.75L in the case where L>3W and D≥L in the case where L<3W.

Here, a result obtained by manufacturing semiconductor modules while variously changing the inclination angle α and examining whether to satisfy the acceptable standards of IPC-A-610 will be described. For example, in the case where W=1.2 mm and L=1.7 mm (i.e. in the case where L<3W), when the inclination angle α is 5°, D=1.88 mm, and when the inclination angle α is 7.5°, D=1.70 mm, and both cases satisfied the acceptable standards of IPC-A-610. In contrast, when the inclination angle α is 8.5°, D=1.68 mm, and this case did not satisfy the acceptable standards of IPC-A-610.

Figure 8:
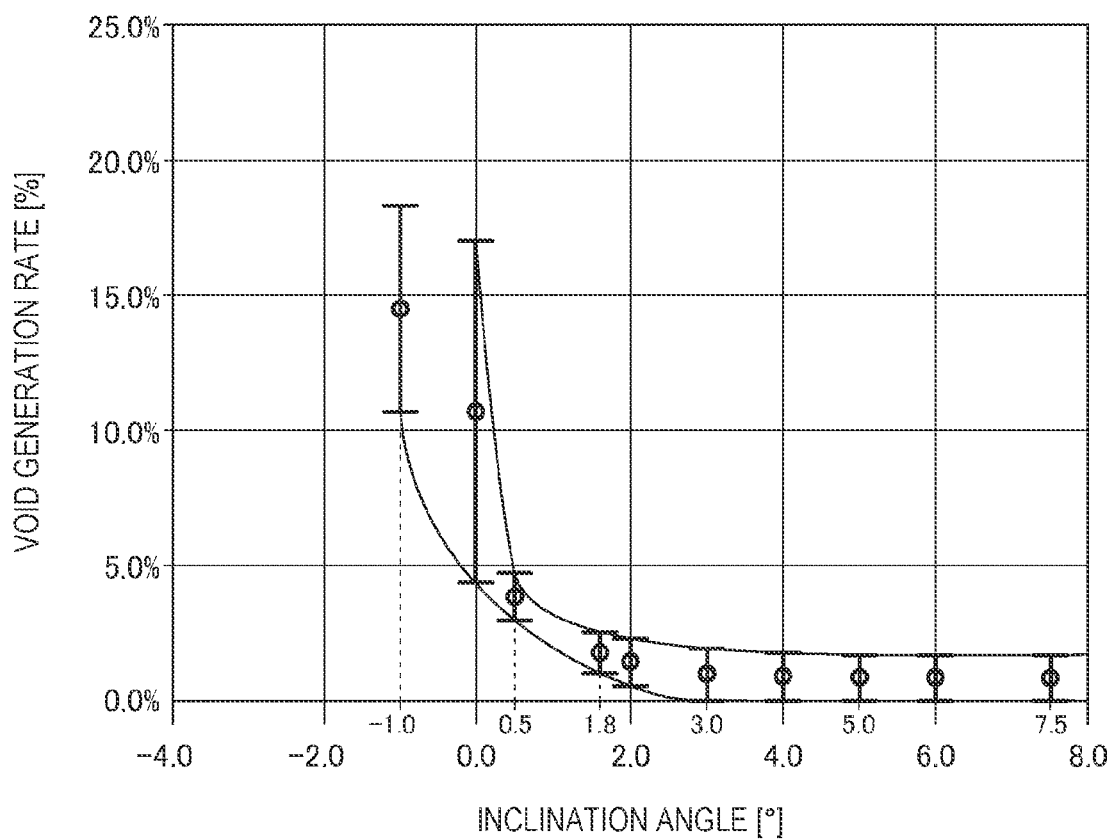
FIG. 8 is a graph illustrating a relationship between the inclination angle and the void generation rate.

Next, a result obtained by manufacturing semiconductor modules while variously changing the inclination angle α and examining the void generation rate in the solder interposed between the joint surface and the surface to be jointed is illustrated in FIG. 8. In detail, 100 semiconductor modules as 1 lot were manufactured for each angle, and the void generation rates were examined for 3 lots or more of the semiconductor modules for each angle. Then, for each angle, a maximum value and a minimum value among the void generation rates of all of the semiconductor modules were plotted, and an average value of all of the void generation rates was plotted.

It is clear from the graph of FIG. 8 that the void generation rate is kept below 5% when the inclination angle α is 0.5° or more. When the inclination angle α is 0.5° or more, the void generation rate is low, and furthermore, the variation in the void generation rate is small. When the inclination angle α is less than 0.5°, the void generation rate rapidly becomes high, and furthermore, the variation in the void generation rate rapidly becomes large.

However, when the inclination angle α is large, the distance between the joint surface and the surface to be jointed becomes large and the thickness of the interposed solder becomes large. Therefore, the inclination angle α is preferably 7.5° or less, more preferably 6.0° or less, and further preferably 5.0° or less.

In consideration of manufacturing errors and variations of the shape of the metal plate connector, the inclination angle α is preferably 2.5° or more, and more preferably 3.0° or more.

Furthermore, as the inclination angle α to be desired when manufacturing the metal plate connector (processing a metal plate), 4° that is the median value between the lower limit value 0.5° and the upper limit value 7.5° in the preferable range is most preferable. However, since the tolerance is supposed to be plus or minus 2°, the inclination angle α is more preferably 2° or more and 6° or less.

Therefore, in consideration of these points, the inclination angle α is preferably 0.5° or more and 7.5° or less, more preferably 2° or more and 6° or less, and further preferably 3.0° or more and 5.0° or less.

On the other hand, when the inclination angle α is less than 0° (in other words, when the above-described inclination direction is opposite from that in the present embodiment) as well as when the inclination angle α is 0° (in other words, when the joint surface and the surface to be jointed are parallel), since the air bubbles are difficult to be released from the solder interposed between the joint surface and the surface to be jointed, the variation in the void generation rate was large and the void generation rate exceeded 5% in some cases.

In this way, the metal plate connectors 36a and 36b include an outgas releasing mechanism that makes the outgas generated from the molten solder during the solder jointing of the metal plate connectors 36a and 36b be released from the solders 34b, 34c, 34e, and 34f interposed between the joint surfaces and the surfaces to be jointed. In other words, each of the joint surfaces of the electrode-jointing portions 36ab and 36bb which are opposed to the surfaces to be jointed of the electrodes S and G of the bare-chip FET 35 and the joint surfaces of the substrate-jointing portions 36ac and 36bc which are opposed to the surfaces to be jointed of the other wiring patterns 33b and 33c is inclined with respect to each of the surfaces to be jointed, so that the outgas releasing mechanism is constituted. As a result, the void generation rates in the solders 34b, 34c, 34e, and 34f interposed between the joint surfaces and the surfaces to be jointed can be kept low, and thus the reliability of electric connection by a solder is high.

The inclination angles α between the joint surfaces of the electrode-jointing portions 36ab and 36bb and the surfaces to be jointed of the electrodes S and G of the bare-chip FET 35 and the inclination angles α between the joint surfaces of the substrate-jointing portions 36ac and 36bc and the surfaces to be jointed of the wiring patterns 33b and 33c may be the same or different.

In addition, since the joint surfaces of the electrode-jointing portions 36ab and 36bb and the substrate-jointing portions 36ac and 36bc are respectively inclined with respect to the surfaces to be jointed, the contact form between the joint surfaces and the surfaces to be jointed is not surface contact but line contact. Therefore, the metal plate connectors 36a and 36b are relatively more difficult to free-stand compared to the case where the contact form between the joint surfaces and the surfaces to be jointed is surface contact.

However, when the joint surfaces are inclined with respect to the surfaces to be jointed, inward force in the one direction is generated in the first coupling portions 36ad and 36bd and the second coupling portions 36ae and 36be, and thus the metal plate connectors 36a and 36b can stably free-stand. Therefore, the metal plate connectors 36a and 36b are difficult to fall down by vibration or the like. In order to improve the free-standing ability of the metal plate connectors 36a and 36b, the centers of gravity of the metal plate connectors 36a and 36b may be made lower by means described later (a means for providing balancing rib portions, a means for making the thicknesses of the electrode-jointing portion and the substrate-jointing portion larger than the thicknesses of other portions of the metal plate connector).

Furthermore, water-repellent surface treatment may be performed on the joint surfaces of the electrode-jointing portions 36ab and 36bb and the joint surfaces of the substrate-jointing portions 36ac and 36bc. In that case, the wettability is improved by the surface treatment, and thus the resistivity when the air bubbles move obliquely upward along the joint surfaces becomes small, and the air bubbles become easier to be released from the solder interposed between the joint surfaces and the surfaces to be jointed. The type of the water-repellent surface treatment is not particularly limited, and examples thereof include tin-copper alloy plating.

Furthermore, oxidation resistant treatment may be performed on the joint surfaces of the electrode-jointing portions 36ab and 36bb and the joint surfaces of the substrate-jointing portions 36ac and 36bc. The wettability of the solder is decreased when an oxide film is formed on the joint surface. However, when the oxidation resistant treatment is performed, an oxidation film is not formed and the wettability of the solder is high, and thus the solder is easy to flow from the electrode-jointing portions 36ab and 36bb and the substrate-jointing portions 36ac and 36bc to the flat plate portions 36aa and 36ba. As a result, a solder fillet can be more stably formed. The type of the oxidation resistant treatment is not particularly limited, and examples thereof include tin plating.

The oxidation resistant treatment may be performed on the whole of the surface of the metal plate connectors 36a and 36b, or may be performed on only a portion with which the solder fillet to be formed comes in contact. For example, the oxidation resistant treatment may be performed on the whole of the joint surfaces of the electrode-jointing portions 36ab and 36bb and the joint surfaces of the substrate-jointing portions 36ac and 36bc, the whole of the inner surfaces of the first coupling portions 36ad and 36bd and the second coupling portions 36ae and 36be, and the whole of the lower surfaces of the flat plate portions 36aa and 36ba.

Alternatively, the oxidation resistant treatment may be performed on the whole of the joint surfaces of the electrode-jointing portions 36ab and 36bb and the joint surfaces of the substrate-jointing portions 36ac and 36bc, and the lower portions of the inner surfaces of the first coupling portions 36ad and 36bd and the second coupling portions 36ae and 36be (for example, to the position in the middle of the height of the metal plate connectors 36a and 36b in the up-down direction). When the oxidation resistant treatment is performed on only the lower portions of the inner surfaces of the first coupling portions 36ad and 36bd and the second coupling portions 36ae and 36be in this manner, the formation part of the solder fillet can be controlled because the solder fillet is difficult to be formed on the lower surfaces of the flat plate portions 36aa and 36ba. When the oxidation resistant treatment is performed after performing masking treatment on a part of the surface of the metal plate connectors 36a and 36b, the oxidation resistant treatment can be performed on a desired part.

Furthermore, the shapes of the source-electrode metal plate connector 36a and the gate-electrode metal plate connector 36b may be those illustrated in FIG. 9 and FIG. 10A to FIG. 10C, for example. Since the shapes of the source-electrode metal plate connector 36a and the gate-electrode metal plate connector 36b are substantially the same, hereinafter, only the shape of the gate-electrode metal plate connector 36b will be described later, and the description of the shape of the source-electrode metal plate connector 36a will be omitted.

The shape of the gate-electrode metal plate connector 36b has the above-described bridge shape, and as described in more detail, the gate-electrode metal plate connector 36b includes the flat plate portion 36ba, the first coupling portion 36bd that extends downward from one end of the flat plate portion 36ba in the one direction (X-axis direction in FIG. 9) via a first bent portion 36bf, and the second coupling portion 36be that extends downward from the other end of the flat plate portion 36ba in the one direction via a third bent portion 36bh to form a bridge shape (to constitute a bridge of a hat shape). The electrode-jointing portion 36bb is formed to be bent from the first coupling portion 36bd via a second bent portion 36bg and extend outward in the one direction, and the substrate-jointing portion 36bc is formed to be bent from the second coupling portion 36be via a fourth bent portion 36bi and extend outward in the one direction.

In addition, the first coupling portion 36bd has a width narrow portion 36bj in the vicinity of the electrode-jointing portion 36bb. The width narrow portion 36bj has a tapered shape in which the width (length in Y-axis direction in FIG. 9) becomes narrower from the first bent portion 36bf toward the second bent portion 36bg. In contrast, the second coupling portion 36be does not have a width narrow portion, and has a width substantially the same as that of the flat plate portion 36ba. Therefore, as illustrated in FIG. 10A to FIG. 10C, a width W1 of the electrode-jointing portion 36bb in a direction perpendicular to the one direction (Y-axis direction in FIG. 9, and up-down direction in FIG. 10A to FIG. 10C) is narrower than a width W2 of the substrate-jointing portion 36bc in the direction perpendicular to the one direction.

In this way, by making the width W1 of the electrode-jointing portion 36bb in the direction perpendicular to the one direction narrower than the width W2 of the substrate-jointing portion 36bc in the direction perpendicular to the one direction in the gate-electrode metal plate connector 36b, the gate-electrode metal plate connector 36b can free-stand on the top surfaces of the bare-chip FET 35 and the substrate 31 at total three points of one point on the side of the electrode-jointing portion 36bb having a narrow width and two points (two points in the vicinity of both ends of the substrate-jointing portion 36bc in the width direction) on the side of the substrate-jointing portion 36bc having a wide width. Accordingly, as will be described later, when the gate-electrode metal plate connector 36b is solder-jointed on the bare-chip FET 35 and the substrate 31 by reflow, it is possible to decrease a possibility that the gate-electrode metal plate connector 36b will fall down. Accordingly, even when the bare-chip FET 35 and the gate-electrode metal plate connector 36b are decreased in size, it is possible to improve the assemblability thereof.

In addition, the gate-electrode metal plate connector 36b can free-stand on the bare-chip FET 35 and the substrate 31 at total three points of one point on the side of the electrode-jointing portion 36bb having a narrow width and two points on the side of the substrate-jointing portion 36bc having a wide width. Accordingly, the electrode-jointing portion 36bb comes in contact with the gate electrode G of the bare-chip FET 35 at an appropriate position in spite of torsion by press forming, and the arrangement position accuracy in the solder jointing is improved. Accordingly, the jointing reliability between the electrode-jointing portion 36bb and the gate electrode G of the bare-chip FET 35 which are solder-jointed can be kept high. In order to decrease the size of the bare-chip FET 35, it is preferable that the size of the gate electrode G formed on the top surface thereof be decreased. Even if the width W1 of the electrode-jointing portion 36bb is made narrower than the width W2 of the substrate-jointing portion 36bc, when the gate electrode G formed on the bare-chip FET 35 is small, the jointing reliability causes no problem.

The gate-electrode metal plate connector 36b fall down very easily when both the electrode-jointing portion 36bb and the substrate-jointing portion 36bc are made to have narrow widths in the gate-electrode metal plate connector 36b, and the gate-electrode metal plate connector 36b is made to free-stand on the bare-chip FET 35 and the substrate 31 at total two points of one point on the side of the electrode-jointing portion 36bb having a narrow width and one point on the side of the substrate-jointing portion 36bc having a narrow width.

In addition, the electrode-jointing portion 36bb in the gate-electrode metal plate connector 36b is located substantially at the center of the substrate-jointing portion 36bc in the width direction perpendicular to the one direction.

Accordingly, the electrode-jointing portion 36bb having a narrow width is located at a position well balanced with respect to the width direction of the substrate-jointing portion 36bc. Accordingly, when the gate-electrode metal plate connector 36b free-stands on the bare-chip FET 35 and the substrate 31 at total three points of one point on the side of the electrode-jointing portion 36bb having a narrow width and two points on the side of the substrate-jointing portion 36bc having a wide width, the free-standing ability of the gate-electrode metal plate connector 36b can be improved by the good balance in positioning of the electrode-jointing portion 36bb.

Furthermore, in order to further improve the free-standing ability of the gate-electrode metal plate connector 36b, the center of gravity of the gate-electrode metal plate connector 36b may be made lower by providing balancing rib portions 36bl for the gate-electrode metal plate connector 36b, or making the thicknesses of the electrode-jointing portion 36bb and the substrate-jointing portion 36bc larger than the thicknesses of other portions of the metal plate connector.

Figure 11A:
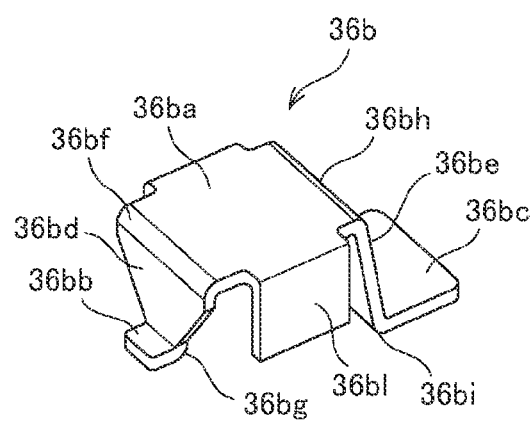
FIG. 11A and FIG. 11B are perspective views illustrating the metal plate connector having balancing rib portions.

First, the balancing rib portions 36bl will be described. In the gate-electrode metal plate connector 36b, as illustrated in FIG. 11A, at both ends of the flat plate portion 36ba in the direction perpendicular to the one direction, which is provided between the electrode-jointing portion 36bb and the substrate-jointing portion 36bc, the balancing rib portions 36bl and 36bl may be respectively formed to be bent down from the both ends.

The position of the center of gravity of the gate-electrode metal plate connector 36b is lowered by the balancing rib portions 36bl, and the free-standing ability of the gate-electrode metal plate connector 36b is improved. Thus, when the gate-electrode metal plate connector 36b free-stands on the top surfaces of the bare-chip transistor and the substrate at total three points of one point on the side of the electrode-jointing portion 36bb having a narrow width and two points on the side of the substrate-jointing portion 36bc having a wide width, the free-standing ability is stably improved. Therefore, when the gate-electrode metal plate connector 36b is solder-jointed on the bare-chip transistor and the substrate by reflow, falling down of the gate-electrode metal plate connector 36b can be reliably prevented and the reliability of the solder jointing can be improved.

Figure 12A:
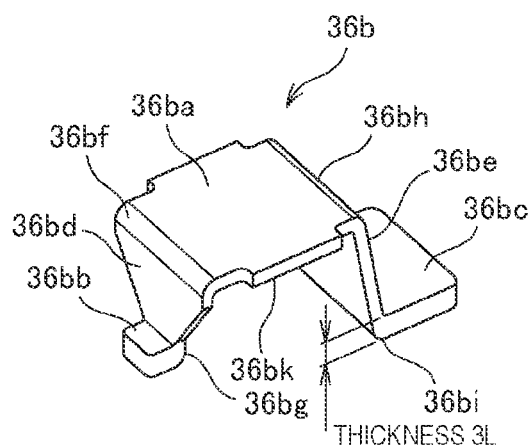
FIG. 12A and FIG. 12B are perspective views illustrating the metal plate connector in which the electrode-jointing portion and the substrate-jointing portion have large thicknesses.

Next, the thicknesses of the electrode-jointing portion 36bb and the substrate-jointing portion 36bc will be described. In the gate-electrode metal plate connector 36b, as illustrated in FIG. 12A, the plate thicknesses of the electrode-jointing portion 36bb and the substrate-jointing portion 36bc of the gate-electrode metal plate connector 36b may be larger than the plate thicknesses of the other portions (that is, the flat plate portion 36ba, the first coupling portion 36bd, and the second coupling portion 36be) of the gate-electrode metal plate connector 36b. The size of the plate thicknesses of the electrode-jointing portion 36bb and the substrate-jointing portion 36bc may be, but not particularly limited to, for example, about three times (3L) the plate thicknesses L of the other portions (that is, the flat plate portion 36ba, the first coupling portion 36bd, and the second coupling portion 36be) of the gate-electrode metal plate connector 36b.

Since the plate thicknesses of the electrode-jointing portion 36bb and the substrate-jointing portion 36bc are large, the position of the center of gravity of the gate-electrode metal plate connector 36b is lowered, and the free-standing ability is improved. Thus, when the gate-electrode metal plate connector 36b free-stands on the top surfaces of the bare-chip transistor and the substrate at total three points of one point on the side of the electrode-jointing portion 36bb having a narrow width and two points on the side of the substrate-jointing portion 36bc having a wide width, the free-standing ability is stably improved. Therefore, when the gate-electrode metal plate connector 36b is solder-jointed on the bare-chip transistor and the substrate by reflow, falling down of the gate-electrode metal plate connector 36b can be reliably prevented and the reliability of the solder jointing can be improved.

In addition, in the gate-electrode metal plate connector 36b, a stress-reducing portion is arranged between the electrode-jointing portion 36bb and the substrate-jointing portion 36bc. The stress-reducing portion is constituted of a bridge shape including the flat plate portion 36ba, the first coupling portion 36bd bent down from one end of the flat plate portion 36ba via the first bent portion 36bf, and the second coupling portion 36be bent down from the other end of the flat plate portion 36ba via the third bent portion 36bh.

The gate-electrode metal plate connector 36b is made into a bridge shape such that the respective sides of the bridge shape (the flat plate portion 36ba, the first coupling portion 36bd, and the second coupling portion 36be) not only expand and contract, but also are deformable in a direction in which the respective bent portions 36bf, 36bg, 36bh, and 36bi are bending. Thus, the effect of a plate spring is obtained, and displacement in the up-down and right-and-left directions (Z-axis direction and X-axis direction in FIG. 9) is absorbable by virtue of a bridge shape framework. That is, in a case where deformation of the substrate 31 and the metal plate connectors 36a and 36b occurs due to thermal expansion or thermal contraction, the metal plate connectors 36a and 36b can be easily bent.

In this way, by arranging the stress-reducing portion between the electrode-jointing portion 36bb and the substrate-jointing portion 36bc, it is possible to absorb a difference in linear expansion coefficient between the bare-chip FET 35 and the gate-electrode metal plate connector 36b, a difference in linear expansion coefficient between the substrate 31 and the gate-electrode metal plate connector 36b, and a difference in linear expansion coefficient between the bare-chip FET 35 and the substrate 31. Accordingly, it is possible to reduce a thermal stress acting on the solder jointing portion between the bare-chip FET 35 and the gate-electrode metal plate connector 36b and the solder jointing portion between the gate-electrode metal plate connector 36b and the substrate 31 (that is, the wiring pattern 33c), and thus to ensure the jointing reliability of the gate-electrode metal plate connector 36b to the bare-chip FET 35 and the substrate 31. In addition, the substrate 31 is made of aluminum, the linear expansion coefficient thereof is about $23.6 \times 10^{-6}/°$ C., and the linear expansion coefficient of the gate-electrode metal plate connector 36b made of a copper plate is about $16.8 \times 10^{-6}/°$ C. The bare-chip FET is made of silicon and the linear expansion coefficient thereof is about $2.5 \times 10^{-6}/°$ C.

On the other hand, when the stress-reducing portion is arranged between the electrode-jointing portion 36bb and the substrate-jointing portion 36bc, the stress-reducing portion is generally formed in a wavelike shape (a bridge shape in the present embodiment) and thus the gate-electrode metal plate connector 36b has a shape having difficulty in free-standing. However, by making the width W1 of the electrode-jointing portion 36bb in the direction perpendicular to the one direction narrower than the width W2 of the substrate-jointing portion 36bc in the direction perpendicular to the one direction in the gate-electrode metal plate connector 36b, the gate-electrode metal plate connector 36b can free-stand on the bare-chip FET 35 and the substrate 31 at total three points of one point on the side of the electrode-jointing portion 36bb having a narrow width and two points on the side of the substrate-jointing portion 36bc having a wide width, and thus the free-standing ability of the gate-electrode metal plate connector 36b is ensured.

Furthermore, the first coupling portion 36bd in the gate-electrode metal plate connector 36b is formed to have a tapered shape in which the width gradually decreases from the flat plate portion 36ba to the electrode-jointing portion 36bb as illustrated in FIG. 10A to FIG. 10C, and a bending baseline of the electrode-jointing portion 36bb, that is, a baseline of the second bent portion 36bg is the narrowest portion of the first coupling portion 36bd.

In this way, since the bending baseline of the electrode-jointing portion 36bb is the narrowest portion of the first coupling portion 36bd having a tapered shape, the electrode-jointing portion 36bb can be easily deformed at the bending baseline. Accordingly, when the gate-electrode metal plate connector 36b is deformed in the solder jointing or the like due to the difference in linear expansion coefficient between the bare-chip FET 35 and the gate-electrode metal plate connector 36b, the difference in linear expansion coefficient between the substrate 31 and the gate-electrode metal plate connector 36b, and the difference in linear expansion coefficient between the bare-chip FET 35 and the substrate 31, the electrode-jointing portion 36bb can be easily deformed at the bending baseline. As a result, it is possible to ensure the jointing reliability of the electrode-jointing portion 36bb to the gate electrode G.

Figure 9:
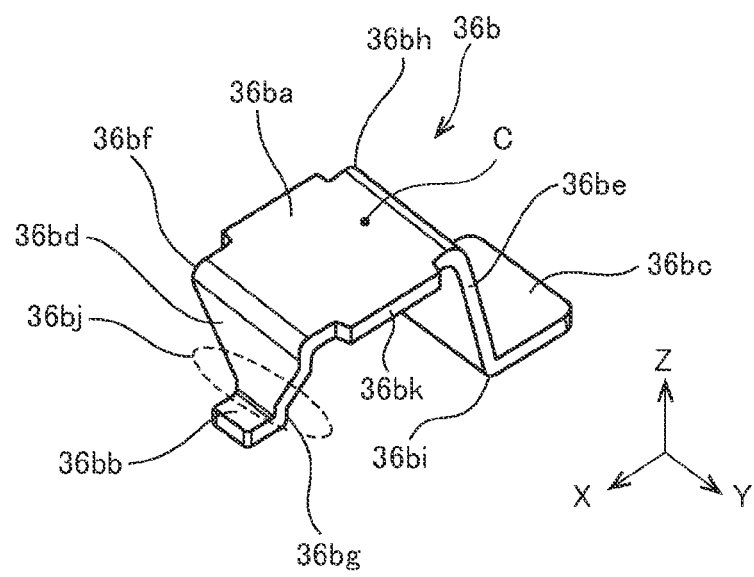
FIG. 9 is a perspective view illustrating an example of the shape of the metal plate connector.

Furthermore, as illustrated in FIG. 9 and FIG. 10A to FIG. 10C, in the gate-electrode metal plate connector 36b, progressive cut portions 36bk formed by a progressive press in press forming are provided at both ends of the flat plate portion 36ba in the width direction (Y-axis direction in FIG. 9, and up-down direction in FIG. 10A to FIG. 10C). The progressive cut portions 36bk are formed to protrude outward in the width direction of the flat plate portion 36ba.

Since the progressive cut portions 36bk are arranged at a flat surface (flat plate portion 36ba) of the gate-electrode metal plate connector 36b, cutting is easily performed and deformation of components in a cutting process can be suppressed. Furthermore, since the progressive cut portions 36bk are formed to protrude outward from the flat plate portion 36ba, cutting can be performed without deforming the flat surface of the flat plate portion 36ba.

Figure 13:
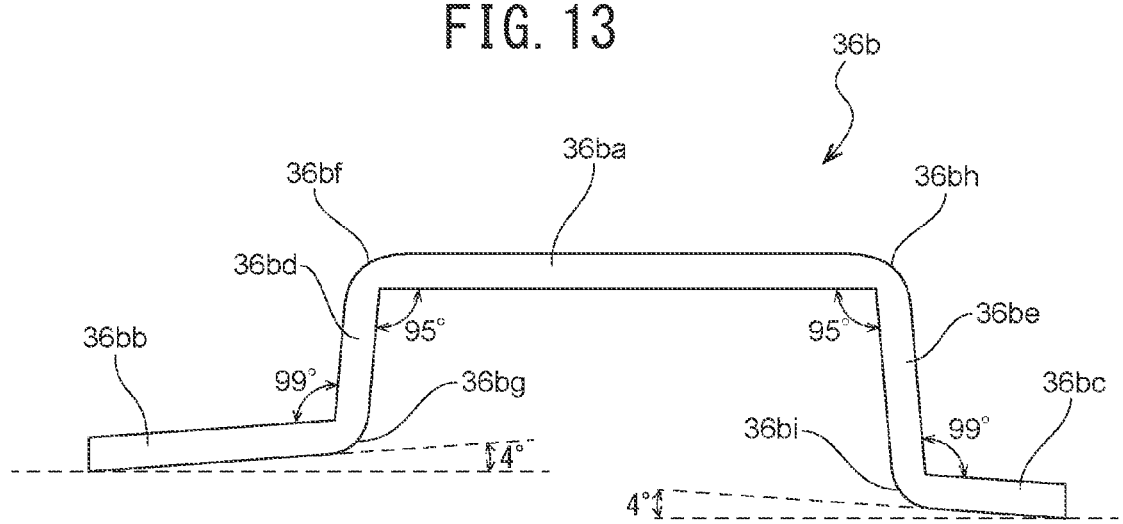
FIG. 13 is a side view illustrating the shape of the metal plate connector of FIG. 9 and FIG. 10A to FIG. 10C.

In addition, the gate-electrode metal plate connector 36b includes the four bent portions (36bf, 36bg, 36bh, 36bi) and has a bridge shape. Here, the angle of each of the bent portions (36bf, 36bg, 36bh, 36bi) may be an obtuse angle (for example, 95°, 99°) as an example illustrated in FIG. 13. As a result, the gate-electrode metal plate connector 36b can be more suitably manufactured using press forming.

In other words, spring back caused by press working can be prevented, and the component accuracy can be improved. Furthermore, since the angles of the four bent portions are obtuse angles, the mold releasability during press forming can be improved, which contributes to reduction in manufacturing costs. In addition, when the angles of the four bent portions are obtuse angles, a stress acts on the gate-electrode metal plate connector 36b inward in the one direction of the flat plate portion 36ba, and thus the gate-electrode metal plate connector 36b can be placed in a stable state.

Furthermore, the center of gravity C can be provided at the flat surface (flat plate portion 36ba) of a substantially middle portion of the gate-electrode metal plate connector 36b by making the gate-electrode metal plate connector 36b be the bridge shape (see FIG. 9). Therefore, when the gate-electrode metal plate connector 36b is suctioned and held by a transfer jig in loading to the substrate 31, the center of gravity C located at this flat surface can be suctioned.

Therefore, the gate-electrode metal plate connector 36b can be suctioned and held in a well-balanced manner, the stability during transfer of the gate-electrode metal plate connector 36b is secured, and the components arrangement position accuracy can be improved. As a result, the reliability of electric connection of the gate-electrode metal plate connector 36b can be secured. The suction range of the position of the center of gravity in the flat plate portion ba of the gate-electrode metal plate connector 36b is preferably an area of about 2 mm², and more preferably an area of about 2 to 5 mm².

Figure 14A:
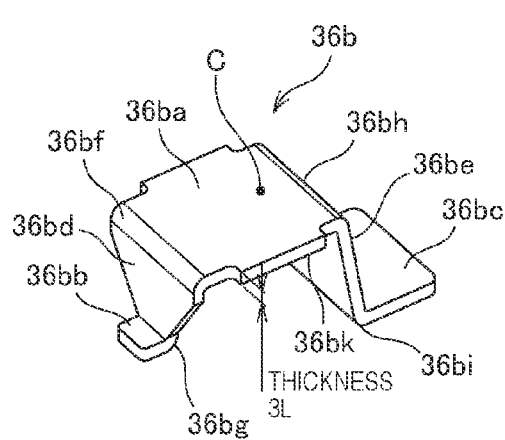
FIG. 14A and FIG. 14B are perspective views illustrating the metal plate connector in which a flat plate portion has a large thickness.

In order to locate the center of gravity (C) on the plane (flat surface) of the flat plate portion 36ba of the gate-electrode metal plate connector 36b, for example, as illustrated in FIG. 14A, the thickness of the flat plate portion 36ba is preferably larger than the thicknesses of the other portions of the gate-electrode metal plate connector 36b, that is, the electrode-jointing portion 36bb, the substrate-jointing portion 36bc, the first coupling portion 36bd, and the second coupling portion 36be. The size of the plate thickness of the flat plate portion 36ba may be, but not particularly limited to, for example, about three times (3L) the plate thicknesses L of the other portions of the gate-electrode metal plate connector 36b, that is, the electrode-jointing portion 36bb, the substrate-jointing portion 36bc, the first coupling portion 36bd, and the second coupling portion 36be.

Figure 15:
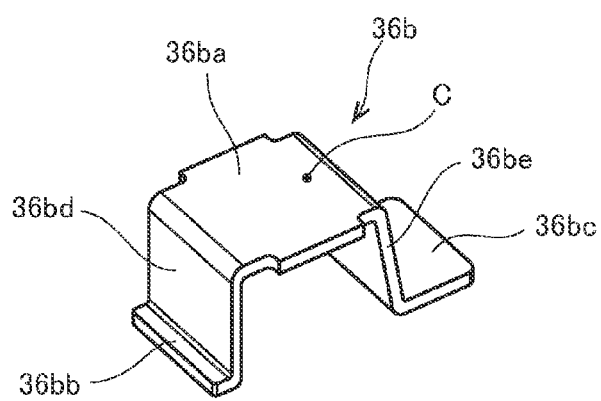
FIG. 15 is a perspective view illustrating another example of the shape of the metal plate connector.

In addition, the gate-electrode metal plate connector 36b may have any shape as long as it has the bridge shape capable of jointing the gate electrode G to the wiring pattern 33c. For example, as illustrated in FIG. 15, the gate-electrode metal plate connector 36b may have a shape in which no width narrow portion 36bj is provided. In other words, the gate-electrode metal plate connector 36b may have a shape in which the widths of the first coupling portion 36bd, the electrode-jointing portion 36bb, the second coupling portion 36be, and the substrate-jointing portion 36bc are substantially the same as the width of the flat plate portion 36ba.

Figure 11B:
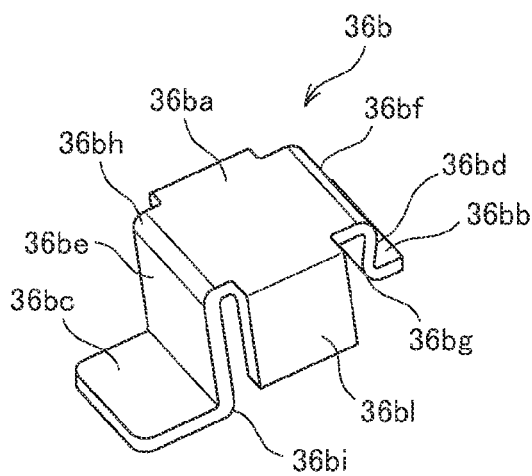
Figure 12B:
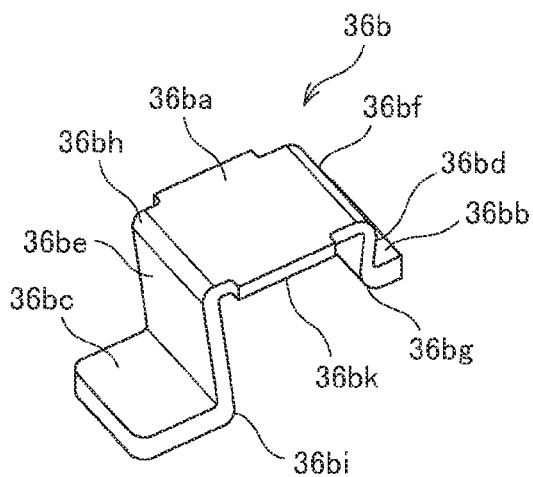
Figure 14B:
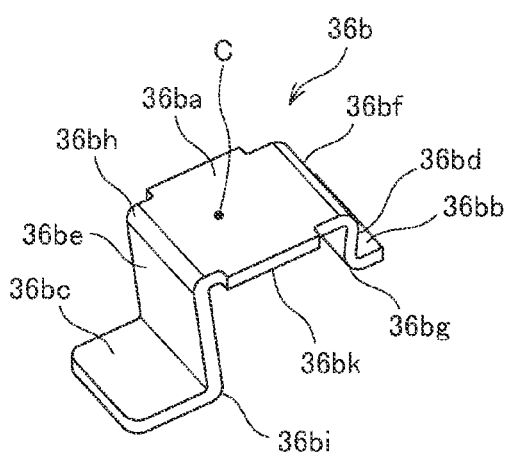

Also in the gate-electrode metal plate connector 36b having the shape illustrated in FIG. 15, the balancing rib portions 36bl may be provided so as to improve the free-standing ability of the gate-electrode metal plate connector 36b (see FIG. 11B), as is the case with the gate-electrode metal plate connector 36b having the shape illustrated in FIG. 9. In addition, similarly, the thicknesses of the electrode-jointing portion 36bb and the substrate-jointing portion 36bc may be larger than the thicknesses of the other portions of the metal plate connector (see FIG. 12B). Furthermore, in order to locate the center of gravity (C) on the plane (flat surface) of the flat plate portion 36ba of the gate-electrode metal plate connector 36b, the thickness of the flat plate portion 36ba may be larger than the thicknesses of the other portions of the gate-electrode metal plate connector 36b (see FIG. 14B).

Next, a manufacturing process of the semiconductor module 30 will be described with reference to FIG. 16A to FIG. 16E.

Figure 16A:
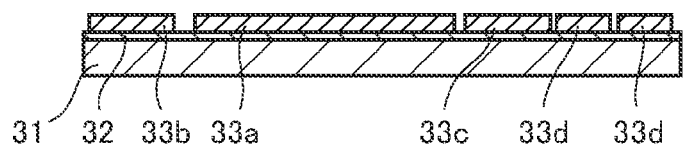
FIG. 16A to FIG. 16E are diagrams for describing a manufacturing process of the semiconductor module.

In manufacturing the semiconductor module 30, first, as illustrated in FIG. 16A, the insulating layer 32 is formed on one main surface of the substrate 31 made of metal (insulating layer forming step).

Then, as illustrated in FIG. 16A, the plural wiring patterns 33a to 33d are formed on the insulating layer 32 (wiring pattern forming step).

Figure 16B:
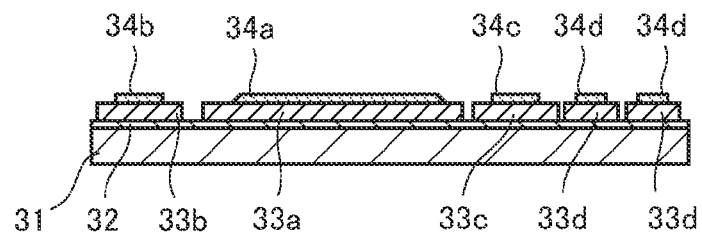

Thereafter, as illustrated in FIG. 16B, solder pastes (the solders 34a to 34d) are applied on the plural wiring patterns 33a to 33d, respectively (solder paste applying step).

Figure 16C:
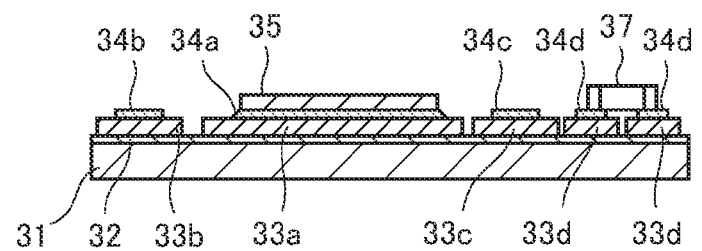

Then, as illustrated in FIG. 16C, one bare-chip FET 35 is mounted on the solder paste (the solder 34a) applied onto one wiring pattern 33a among the plural wiring patterns 33a to 33d (bare-chip FET mounting step), and the other substrate-mounted component 37 is mounted on the solder paste (the solder 34d) applied onto another wiring pattern 33d. Another bare-chip FET 35 is also mounted on a wiring pattern identical to or different from the wiring pattern 33a.

Figure 16D:
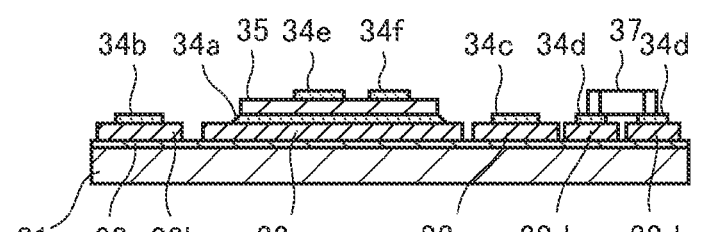

Subsequently, as illustrated in FIG. 16D, solder pastes (the solders 34e and 34f) are applied onto the source electrode S and the gate electrode G formed on the top surface of the bare-chip FET 35 (solder paste applying step).

Figure 16E:
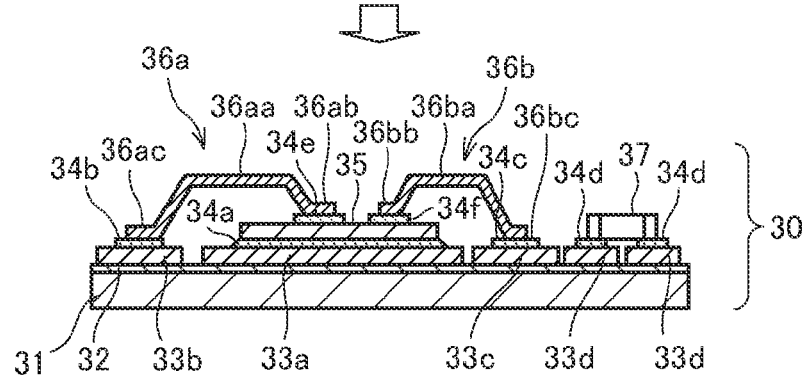

Thereafter, as illustrated in FIG. 16E, the source-electrode metal plate connector 36a is mounted on the solder paste (the solder 34e) applied onto the source electrode S of the bare-chip FET 35 and the solder paste (the solder 34b) applied onto another wiring pattern 33b other than the wiring pattern 33a on which the bare-chip FET 35 is mounted, among the plural wiring patterns 33a to 33d (source-electrode metal plate connector mounting step).

In addition, as illustrated in FIG. 16E, the gate-electrode metal plate connector 36b is mounted on the solder paste (the solder 34f) applied onto the gate electrode G of the bare-chip FET 35 and the solder paste (the solder 34c) applied onto still another wiring pattern 33c other than the wiring pattern 33a on which the bare-chip FET 35 is mounted and other than the wiring pattern 33b on which the source-electrode metal plate connector 36a is mounted, among the plural wiring patterns 33a to 33d (gate-electrode metal plate connector mounting step). An intermediate semiconductor module assembly is constructed in this way.

The intermediate semiconductor module assembly constructed through the steps described above is put into a reflow furnace (not illustrated), and the jointing between one wiring pattern 33a among the plural wiring patterns 33a to 33d and the bare-chip FET 35 via the solder 34a, the jointing between the wiring pattern 33d and the other substrate-mounted component 37 via the solder 34d, the jointing between the source electrode S formed on the top surface of the bare-chip FET 35 and the source-electrode metal plate connector 36a via the solder 34e, the jointing between another wiring pattern 33b among the plural wiring patterns 33a to 33d and the source-electrode metal plate connector 36a, the jointing between the gate electrode G formed on the top surface of the bare-chip FET 35 and the gate-electrode metal plate connector 36b via the solder 34f, and the jointing between still another wiring pattern 33c among the plural wiring patterns 33a to 33d and the gate-electrode metal plate connector 36b via the solder 34c are collectively carried out (jointing step). The semiconductor module 30 is completed in this way.

Here, since the source electrode S of the bare-chip FET 35 and the wiring pattern 33b on the substrate 31, and the gate electrode G of the bare-chip FET 35 and another wiring pattern 33c on the substrate 31 can be jointed by the solder mounting operation using the source-electrode metal plate connector 36a and the gate-electrode metal plate connector 36b, it is possible to carry out the jointing between the source electrode S of the bare-chip FET 35 and the wiring pattern 33b on the substrate 31 and the jointing between the gate electrode G of the bare-chip FET 35 and another wiring pattern 33c on the substrate 31, simultaneously in the same apparatus and in the same process as the solder mounting operation for mounting the bare-chip FET 35 or the other substrate-mounted component 37 on the wiring patterns 33a and 33d on the substrate 31. As a result, it is possible to shorten the manufacturing tact time of the semiconductor module 30, to make a dedicated wire bonding apparatus unnecessary, and to reduce the manufacturing costs of the semiconductor module 30.

In addition, in the jointing step in a reflow furnace, the width W1 of the electrode-jointing portion 36bb in the direction perpendicular to the one direction is narrower than the width W2 of the substrate-jointing portion 36bc in the direction perpendicular to the one direction in the gate-electrode metal plate connector 36b, and the gate-electrode metal plate connector 36b can free-stand on the top surfaces of the bare-chip FET 35 and the substrate 31 at total three points of one point on the side of the electrode-jointing portion 36bb having a narrow width and two points (two points in the vicinity of both ends of the substrate-jointing portion 36bc in the width direction) on the side of the substrate-jointing portion 36bc having a wide width. Accordingly, when the gate-electrode metal plate connector 36b is solder-jointed on the bare-chip FET 35 and the substrate 31 by reflow, it is possible to decrease a possibility that the gate-electrode metal plate connector 36b will fall down. Accordingly, even when the bare-chip FET 35 and the gate-electrode metal plate connector 36b are decreased in size, it is possible to improve the assemblability thereof.

Furthermore, the substrate 31 of the semiconductor module 30 is made of aluminum, and the source-electrode metal plate connector 36a and the gate-electrode metal plate connector 36b are made of a metal material having both stiffness and high electric conductivity. The linear expansion coefficient of aluminum is $23.6 \times 10^{-6}/°$ C., and the linear expansion coefficient of the copper material is $16.8 \times 10^{-6}/°$ C. as an example. That is, the substrate 31 is more easily deformed by a temperature change than the source-electrode metal plate connector 36a and the gate-electrode metal plate connector 36b.

Therefore, if the temperature becomes high in a reflow process or due to heat generation during an electric power steering (EPS) operation, a stress is applied to the metal plate connectors 36a and 36b due to a difference in the coefficients of expansion of the substrate 31 and the metal plate connectors 36a and 36b. At this time, when the metal plate connectors 36a and 36b have the structure that cannot reduce this stress, the solder jointing to the bare-chip FET 35 may be separated.

In contrast, in the present embodiment, the metal plate connectors 36a and 36b are made into a bridge shape such that the respective sides of the bridge shape (the flat plate portions 36aa and 36ba, the first coupling portions 36ad and 36bd, and the second coupling portions 36ae and 36be) not only expand and contract, but also are deformable in a direction in which the respective bent portions are bending. Thus, the effect of a plate spring is obtained, and displacement in the up-down and right-and-left directions (Z-axis direction and X-axis direction in FIG. 9) is absorbable by virtue of a bridge shape framework. That is, in a case where deformation of the substrate 31 and the metal plate connectors 36a and 36b occurs due to thermal expansion or thermal contraction, the metal plate connectors 36a and 36b can be easily bent.

In this way, since the metal plate connectors 36a and 36b can appropriately absorb displacement when being deformed in the reflow process and when being deformed due to heat generation during the EPS operation, it is possible to prevent the solder jointing between the metal plate connectors 36a and 36b and the bare-chip FET 35 from separating, and to secure the reliability of electric connection.

While the embodiment of the present invention is described above, the present invention is not limited to the embodiment and can be modified and improved in various forms.

For example, although the bare-chip FET 35 is used in the semiconductor module 30, not only the bare-chip FET 35 but also other bare-chip transistors, such as a bare-chip IGBT, may be used.

When another bare-chip transistor is used, an electrode formed on the top surface of the bare-chip transistor and another wiring pattern other than a wiring pattern to which the bare-chip transistor is jointed, among plural wiring patterns, may be jointed via solders by a metal plate connector. Accordingly, the jointing between the electrode of the bare-chip transistor and the wiring pattern on the substrate can be performed simultaneously in the same apparatus and in the same process as the solder mounting operation for mounting the bare-chip transistor or other substrate-mounted components on the wiring patterns on the substrate.

When a bare-chip IGBT is used as the bare-chip transistor, it is preferable that an emitter electrode and a gate electrode formed on the bare-chip IGBT be jointed to wiring patterns on the substrate, respectively, via solders using a metal plate connector.

In this way, when the bare-chip IGBT is used and the emitter electrode and the gate electrode formed on the bare-chip IGBT are jointed to the wiring patterns on the substrate, respectively, via the solders using the metal plate connector, the jointing between the emitter electrode of the bare-chip IGBT and a wiring pattern on the substrate and the jointing between the gate electrode of the bare-chip IGBT and another wiring pattern on the substrate can be performed simultaneously in the same apparatus and in the same process as the solder mounting operation for mounting the bare-chip IGBT or other substrate-mounted components on the wiring patterns on the substrate.

Figure 17:
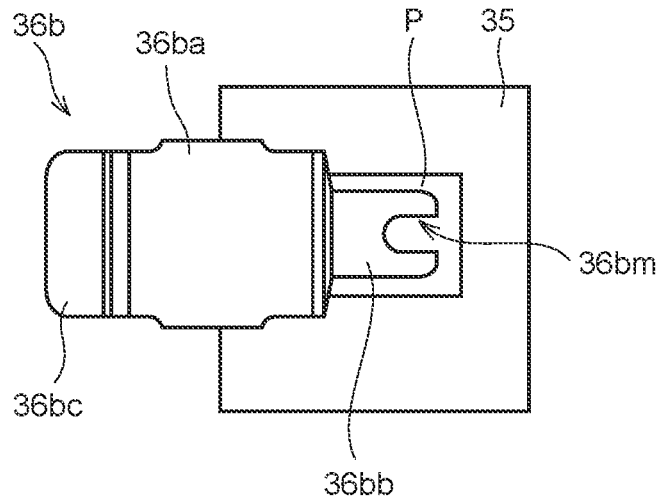
FIG. 17 is a diagram illustrating an example of a stress-reducing portion.
Figure 18:
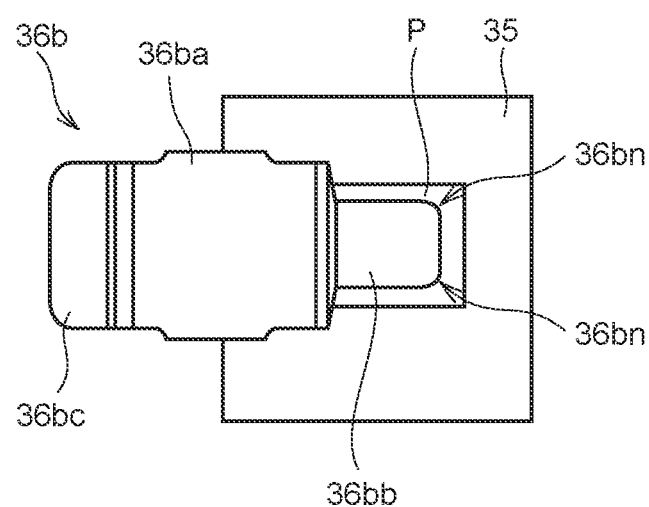
FIG. 18 is a diagram illustrating another example of the stress-reducing portion.
Figure 19:
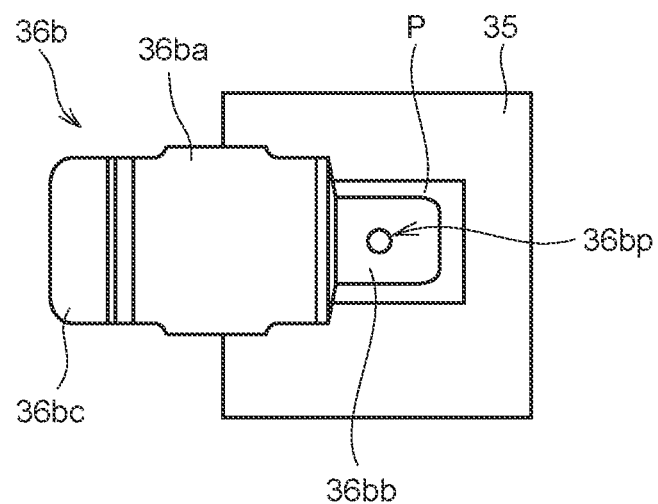
FIG. 19 is a diagram illustrating another example of the stress-reducing portion.
Figure 20:
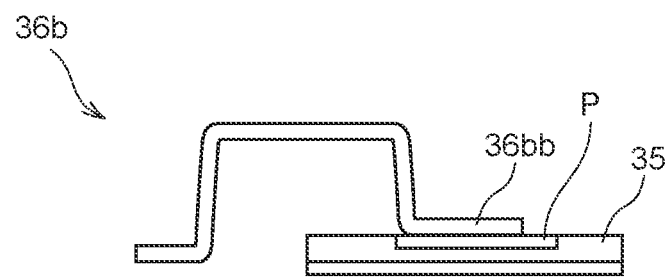
FIG. 20 is a diagram illustrating another example of the stress-reducing portion.

In addition, in the metal plate connectors 36a and 36b, together with the stress-reducing portion constituted of the bridge shape, a stress-reducing portion having another constitution may be further provided. In other words, a stress-reducing portion constituted by forming a notch portion 36bm in the electrode-jointing portions 36ab and 36bb and the substrate-jointing portions 36ac and 36bc (see FIG. 17), a stress-reducing portion constituted by forming chamfered portions 36bn (the chamfered portions may be C chamfering in place of R chamfering illustrated in the drawing) at the corners of the end portion of the electrode-jointing portions 36ab and 36bb and the substrate-jointing portions 36ac and 36bc (see FIG. 18), a stress-reducing portion constituted by forming a hole 36bp at the center of the electrode-jointing portions 36ab and 36bb and the substrate-jointing portions 36ac and 36bc (see FIG. 19), and a stress-reducing portion constituted by making the thicknesses of the electrode-jointing portions 36ab and 36bb and the substrate-jointing portions 36ac and 36bc smaller than the thicknesses of the other portions of the metal plate connectors 36a and 36b (see FIG. 20) may be further provided. A symbol P in FIG. 17 to FIG. 20 indicates a source PAD.

When the electrode-jointing portions 36ab and 36bb and the substrate-jointing portions 36ac and 36bc are thermally-deformed by a temperature change generated when applying a current or the like, a compressive stress during expanding and a tensile stress during contracting are generated in the electrode-jointing portions 36ab and 36bb and the substrate-jointing portions 36ac and 36bc. By providing the above-described stress-reducing portions, the compressive stress and the tensile stress due to heat can be dispersed to be reduced, and thus distortion due to heat can be reduced. As a result, the reliability of electric connection can be improved by the synergy of the stress-reducing portion constituted of the bridge shape. Furthermore, by providing the above-described stress-reducing portions in the electrode-jointing portions 36ab and 36bb and the substrate-jointing portions 36ac and 36bc, a stress in a twist direction can be reduced. In particular, when the stress-reducing portion constituted by forming the notch portion 36bm is provided, contact points between the electrode-jointing portions 36ab and 36bb and the bare-chip FET 35, or contact points between the substrate-jointing portions 36ac and 36bc and the wiring patterns 33b and 33c become two, and the width of each of the contact portions becomes narrow, and thus, even when being twisted by thermal deformation, the electrode-jointing portions 36ab and 36bb and the substrate-jointing portions 36ac and 36bc are easy to conform with the twist. In addition, since the contact points become two, that is, a dual system can be constituted, the reliability of electric connection is improved.

In addition, when the stress-reducing portion constituted by making the thicknesses of the electrode-jointing portions 36ab and 36bb and the substrate-jointing portions 36ac and 36bc smaller than the thicknesses of the other portions of the metal plate connectors 36a and 36b is provided, the plate thicknesses of the electrode-jointing portions 36ab and 36bb and the substrate-jointing portions 36ac and 36bc are thin, and thus are easy to be twisted and to absorb displacement in thermal deformation.

Furthermore, when the stress-reducing portion constituted by forming the chamfered portions 36bn at the corners of the end portion of the electrode-jointing portions 36ab and 36bb and the substrate-jointing portions 36ac and 36bc is provided, the effect that, when the electrode-jointing portions 36ab and 36bb and the substrate-jointing portions 36ac and 36bc are twisted by thermal deformation, stress concentration on the corners is made to escape is obtained.

Furthermore, when the stress-reducing portion constituted by forming the hole 36bp at the center of the electrode-jointing portions 36ab and 36bb and the substrate-jointing portions 36ac and 36bc is provided, even when being twisted by thermal deformation, the electrode-jointing portions 36ab and 36bb and the substrate-jointing portions 36ac and 36bc are easy to conform with the twist. In addition, since the solder flows to the top surfaces of the electrode-jointing portions 36ab and 36bb and the substrate-jointing portions 36ac and 36bc to radiate by the permeating and wetting phenomenon, the solder is difficult to be separated when the electrode-jointing portions 36ab and 36bb and the substrate-jointing portions 36ac and 36bc are twisted.

Furthermore, in the semiconductor module 30, the gate-electrode metal plate connector may have one type and the source-electrode metal plate connector may have two types. In other words, the source-electrode metal plate connector has two types including a first source-electrode metal plate connector (see Tr2 and Tr4 in FIG. 4) arranged 180 degrees straightly with respect to the gate-electrode metal plate connector and a second source-electrode metal plate connector (see Tr1, Tr3, and Tr5 in FIG. 4) arranged 90 degrees perpendicularly with respect to the gate-electrode metal plate connector. The one type of gate-electrode metal plate connector and any source-electrode metal plate connector selected from two types of the first source-electrode metal plate connector and the second source-electrode metal plate connector can be used in combination for one bare-chip FET.

The arrangement (the angle between the gate-electrode metal plate connector and the first source-electrode metal plate connector, i.e. the angle between the one direction of the gate-electrode metal plate connector and the one direction of the first source-electrode metal plate connector) of the first source-electrode metal plate connector with respect to the gate-electrode metal plate connector preferably ranges from 95 degrees to 265 degrees, more preferably ranges from 160 degrees to 200 degrees, still more preferably ranges from 175 degrees to 185 degrees, and is most preferably set to 180 degrees.

The arrangement (the angle between the gate-electrode metal plate connector and the second source-electrode metal plate connector, i.e. the angle between the one direction of the gate-electrode metal plate connector and the one direction of the second source-electrode metal plate connector) of the second source-electrode metal plate connector with respect to the gate-electrode metal plate connector preferably ranges from 5 degrees to 175 degrees, more preferably ranges from 70 degrees to 120 degrees, still more preferably ranges from 85 degrees to 95 degrees, and is most preferably set to 90 degrees.

Similarly to the above-mentioned semiconductor module 30, according to this semiconductor module, a degree of freedom in arranging the bare-chip transistor mounted on the substrate increases, a degree of freedom in design of wirings on the substrate increases, and thus the layout of the semiconductor module on the substrate can be made to be compact. It is possible to easily make the path lengths for phases of a three-phase motor on the substrate identical. Accordingly, it is possible to make characteristics of the phases of the three-phase motor, particularly, the impedance characteristics of the phases, easily match each other, thereby improving ripple accuracy of torque, velocity, and so on.

REFERENCE SIGNS LIST

30: semiconductor module
31: substrate
32: insulating layer
33a to 33d: wiring pattern
34a to 34d: solder
35: bare-chip FET (bare-chip transistor)
36a: source-electrode metal plate connector
36aa: flat plate portion
36ab: electrode-jointing portion
36ac: substrate-jointing portion
36b: gate-electrode metal plate connector
36ba: flat plate portion
36bb: electrode-jointing portion
36bc: substrate-jointing portion
36bd: first coupling portion
36be: second coupling portion
36bf: first bent portion
36bg: second bent portion
36bh: third bent portion
36bi: fourth bent portion
36bl: balancing rib portion
G: gate electrode (electrode)
S: source electrode (electrode)

The invention claimed is:

1. A semiconductor module used in an electric power steering apparatus, the semiconductor module comprising:
a substrate made of metal;
an insulating layer formed on the substrate;
a plurality of wiring patterns formed on the insulating layer;
a bare-chip transistor mounted on one wiring pattern among the plurality of wiring patterns via a solder; and
a metal plate connector formed of a metal plate, the metal plate connector jointing an electrode formed on a top surface of the bare-chip transistor and another wiring pattern among the plurality of wiring patterns,
wherein the metal plate connector includes a flat plate portion, an electrode-jointing portion that is arranged on one end side of the flat plate portion in one direction and is jointed to the electrode of the bare-chip transistor via a solder, a substrate-jointing portion that is arranged on the other end side of the flat plate portion in the one direction and is jointed to the another wiring pattern via a solder, a first coupling portion that extends downward from the one end of the flat plate portion in the one direction and couples the one end of the flat plate portion in the one direction to one end of the electrode-jointing portion, and a second coupling portion that extends downward from the other end of the flat plate portion in the one direction and couples the other end of the flat plate portion in the one direction to one end of the substrate-jointing portion to form a bridge shape,
the electrode-jointing portion is formed to be bent from the first coupling portion and extend outward in the one direction, and is formed such that a distance from the flat plate portion in a direction perpendicular to the flat plate portion is, compared to at the one end of the electrode-jointing portion, larger at the other end, such that a joint surface of the electrode-jointing portion is inclined with respect to a surface to be jointed of the electrode of the bare-chip transistor, which is opposed to the joint surface,
the substrate-jointing portion is formed to be bent from the second coupling portion and extend outward in the one direction, and is formed such that the distance from the flat plate portion in the direction perpendicular to the flat plate portion is, compared to at the one end of the substrate-jointing portion, larger at the other end, such that a joint surface of the substrate-jointing portion is inclined with respect to a surface to be jointed of the another wiring pattern, which is opposed to the joint surface,
the joint surface of the electrode-jointing portion that is opposed to the surface to be jointed of the electrode of the bare-chip transistor and the joint surface of the substrate-jointing portion that is opposed to the surface to be jointed of the another wiring pattern include an outgas releasing mechanism that makes outgas generated from the solders molten during solder jointing of the metal plate connector be released from the solders interposed between the joint surfaces and the surfaces to be jointed by making an air bubble of the outgas move obliquely upward along the joint surfaces being inclined, and
the metal plate connector further including a mechanism that makes the outgas be released from the solders interposed between the joint surfaces and the surfaces to be jointed by making the solders molten during solder jointing of the metal plate connector flow along the first coupling portion and the second coupling portion to a lower surface of the flat plate portion and by making the air bubble of the outgas move in association with flowing of the solders.

2. The semiconductor module according to claim 1, wherein an inclination angle between the joint surface of the electrode-jointing portion and the surface to be jointed of the electrode of the bare-chip transistor and an inclination angle between the joint surface of the substrate jointing portion and the surface to be jointed of the another wiring pattern are 0.5° or more and 7.5° or less.

3. The semiconductor module according to claim 1, wherein a width of the electrode-jointing portion in a direction perpendicular to the one direction is narrower than a width of the substrate jointing portion in the direction perpendicular to the one direction.

4. The semiconductor module according to claim 1, wherein, at both ends of the flat plate portion in a direction perpendicular to the one direction, balancing rib portions are respectively formed to be bent down from the both ends.

5. The semiconductor module according to claim 1, wherein thicknesses of the electrode-jointing portion and the substrate jointing portion are larger than a thickness of another portion of the metal plate connector.

6. The semiconductor module according to claim 1, wherein a thickness of the flat plate portion is larger than a thickness of another portion of the metal plate connector.

7. The semiconductor module according to claim 1, wherein water-repellent surface treatment is performed on at least one of the joint surface of the electrode-jointing portion and the joint surface of the substrate-jointing portion.

8. The semiconductor module according to claim 1, wherein oxidation resistant treatment is performed on at least one of the joint surface of the electrode-jointing portion and the joint surface of the substrate-jointing portion.

9. The semiconductor module according to claim 1, wherein oxidation resistant treatment is performed on only a portion of a surface of the metal plate connector with which a fillet of the solder comes in contact.

10. The semiconductor module according to claim 9, wherein oxidation resistant treatment is performed on whole of the joint surface of the electrode-jointing portion, whole of the joint surface of the substrate-jointing portion, whole of an inner surface of the first coupling portion, whole of an inner surface of the second coupling portion, and whole of a lower surface of the flat plate portion.

11. The semiconductor module according to claim 1, wherein the bare-chip transistor is a bare-chip FET having a source electrode and a gate electrode formed on a top surface of the bare-chip FET, the metal plate connector includes a source-electrode metal plate connector and a gate-electrode metal plate connector, the source electrode of the bare-chip FET and the another wiring pattern among the plurality of wiring patterns are jointed by the source-electrode metal plate connector via a solder, the gate electrode of the bare-chip FET and a further another wiring pattern among the plurality of wiring patterns is jointed by the gate-electrode metal plate connector via a solder, the gate-electrode metal plate connector has one type, the source-electrode metal plate connector has two types including a first source-electrode metal plate connector arranged 180 degrees straightly with respect to the gate-electrode metal plate connector and a second source-electrode metal plate connector arranged 90 degrees perpendicularly with respect to the gate-electrode metal plate connector, and the one type of gate-electrode metal plate connector and any source-electrode metal plate connector selected from the two types including the first source-electrode metal plate connector and the second source-electrode metal plate connector are used in combination for one bare-chip FET.

\* \* \* \* \*